(12) United States Patent
Yoo et al.

(10) Patent No.: US 10,510,724 B2
(45) Date of Patent: Dec. 17, 2019

(54) SEMICONDUCTOR DEVICE PACKAGE

(71) Applicant: Samsung Electronics Co., Ltd., Suwon-si (KR)

(72) Inventors: Jae-kyung Yoo, Seoul (KR); Jin-woo Park, Seoul (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/832,266

(22) Filed: Dec. 5, 2017

(65) Prior Publication Data

US 2019/0043831 A1 Feb. 7, 2019

(30) Foreign Application Priority Data

Aug. 3, 2017 (KR) .......................... 10-2017-0098520

(51) Int. Cl.
*H01L 23/02* (2006.01)
*H01L 25/065* (2006.01)
*H01L 21/66* (2006.01)
*H01L 23/31* (2006.01)
*H01L 23/00* (2006.01)
(Continued)

(52) U.S. Cl.
CPC .......... *H01L 25/0657* (2013.01); *H01L 22/12* (2013.01); *H01L 23/3128* (2013.01); *H01L 23/3142* (2013.01); *H01L 23/5384* (2013.01); *H01L 24/14* (2013.01); *H01L 25/50* (2013.01); H01L 21/561 (2013.01); H01L 2224/94 (2013.01); H01L 2224/97 (2013.01); H01L 2225/06513 (2013.01); H01L 2225/06517 (2013.01); H01L 2225/06541 (2013.01); H01L 2924/10158 (2013.01); H01L 2924/15311 (2013.01); H01L 2924/18161 (2013.01)

(58) Field of Classification Search
CPC ................................................... H01L 25/0657
USPC .................................................. 257/787, 686
See application file for complete search history.

(56) References Cited

U.S. PATENT DOCUMENTS 5,904,497 A * 5/1999 Akram .................... H01L 22/20
257/678
6,005,778 A * 12/1999 Spielberger ......... H01L 25/0657
361/770
(Continued)

FOREIGN PATENT DOCUMENTS

KR 10-1472900 12/2014
KR 10-2007-0021319 2/2017

*Primary Examiner* — Nitin Parekh
(74) *Attorney, Agent, or Firm* — Muir Patent Law, PLLC

(57) ABSTRACT

A semiconductor device package includes a buffer layer having an upper surface perpendicular to a first direction, a plurality of semiconductor chips stacked on the buffer layer one by one in the first direction, and a chip sealing material surrounding sidewalls of the semiconductor chips. The semiconductor chips include an upper semiconductor chip at a farthest position from the buffer layer and a remaining plurality of intermediate semiconductor chips. Each of the intermediate semiconductor chips includes through silicon vias (TSVs) passing through each of the intermediate semiconductor chips. The upper semiconductor chip includes a trench formed in at least a portion of a periphery of the upper semiconductor chip and covered by the chip sealing material. Accordingly, the semiconductor device package provides increased device reliability.

22 Claims, 21 Drawing Sheets

(51) Int. Cl.
  *H01L 23/538* (2006.01)
  *H01L 25/00* (2006.01)
  *H01L 21/56* (2006.01)

(56) References Cited

U.S. PATENT DOCUMENTS

| | | | |
|---|---|---|---|
| 6,127,245 A | 10/2000 | Schoenfeld | |
| 6,245,598 B1* | 6/2001 | Chen | H01L 23/3114 257/698 |
| 7,282,793 B2* | 10/2007 | Akram | H01L 23/3185 257/685 |
| 7,838,424 B2* | 11/2010 | Karta | H01L 21/561 257/730 |
| 7,939,916 B2* | 5/2011 | O'Donnell | H01L 21/561 257/659 |
| 8,426,246 B2* | 4/2013 | Toh | H01L 23/481 438/107 |
| 8,486,756 B2 | 7/2013 | Masuda et al. | |
| 8,987,057 B2 | 3/2015 | Van Gemert et al. | |
| 9,257,413 B2 | 2/2016 | Yang et al. | |
| 9,337,063 B2 | 5/2016 | Chen et al. | |
| 9,349,670 B2* | 5/2016 | Zhou | H01L 23/3738 |
| 9,620,430 B2 | 4/2017 | Lu et al. | |
| 2002/0047210 A1* | 4/2002 | Yamada | H01L 21/76898 257/774 |
| 2002/0096754 A1* | 7/2002 | Chen | H01L 24/33 257/686 |
| 2004/0245652 A1* | 12/2004 | Ogata | H01L 24/03 257/777 |
| 2006/0284285 A1* | 12/2006 | Fukazawa | H01L 21/6835 257/618 |
| 2009/0146284 A1 | 6/2009 | Kim et al. | |
| 2010/0096747 A1* | 4/2010 | Kusano | H01L 21/565 257/706 |
| 2014/0091458 A1* | 4/2014 | Van Gemert | H01L 21/561 257/737 |
| 2014/0134798 A1 | 5/2014 | Kim et al. | |
| 2016/0329304 A1* | 11/2016 | Hatakeyama | H01L 24/97 |
| 2017/0147851 A1 | 5/2017 | Wang et al. | |

* cited by examiner

SEMICONDUCTOR DEVICE PACKAGE

CROSS-REFERENCE TO RELATED APPLICATION

This application claims the benefit of Korean Patent Application No. 10-2017-0098520, filed on Aug. 3, 2017, in the Korean Intellectual Property Office, the disclosure of which is incorporated herein in its entirety by reference.

BACKGROUND

The inventive concept relates to a semiconductor device package, and more particularly, to a semiconductor device package including a plurality of semiconductor chips.

Warpage of a semiconductor device package may occur due to a difference in the coefficient of thermal expansion (CTE) between constituent elements of the semiconductor device package. When warpage occurs during the manufacture or testing of the semiconductor device package, the reliability of the semiconductor device package may deteriorate. Accordingly, there is a need to improve the reliability of the semiconductor device package.

SUMMARY

The inventive concept provides a semiconductor device package with improved reliability.

According to an aspect of the inventive concept, there is provided a semiconductor device package comprising a buffer layer having an upper surface perpendicular to a first direction, a plurality of semiconductor chips stacked on the buffer layer one by one in the first direction, and a chip sealing material surrounding sidewalls of the semiconductor chips. The semiconductor chips comprise an upper semiconductor chip at a farthest position from the buffer layer and remaining a plurality of intermediate semiconductor chips. Each of the intermediate semiconductor chips comprises through silicon vias (TSVs) passing through each of the intermediate semiconductor chips. The upper semiconductor chip comprises a trench formed in at least a portion of a periphery of the upper semiconductor chip and covered by the chip sealing material.

According to another aspect of the inventive concept, there is provided a semiconductor device package comprising a buffer layer having an upper surface perpendicular to a first direction, a plurality of semiconductor chips comprising a plurality of intermediate semiconductor chips stacked on the buffer layer one by one in the first direction and an upper semiconductor chip on one of the intermediate semiconductor chip located at a farthest position from the buffer layer, and a chip sealing material comprising a sidewall portion and a protrusion portion. The sidewall portion extends in the first direction, and surrounds sidewalls of the intermediate semiconductor chips. The protrusion portion is located on an upper end of the sidewall portion, and protrudes from an outside of the upper semiconductor chip towards an inner side of the upper semiconductor chip.

According to another aspect of the inventive concept, there is provided a semiconductor device package comprising a buffer layer having an upper surface perpendicular to a first direction, a plurality of intermediate semiconductor chips stacked one the buffer layer one by one in the first direction, an upper semiconductor chip located on an uppermost one of the intermediate semiconductor chips, and a chip sealing material surrounding sidewalls of the intermediate semiconductor chips. A maximum width of an upper portion of the upper semiconductor chip in a second direction, parallel to the upper surface of the buffer layer, is less than a maximum width of a lower portion of the upper semiconductor chip in the second direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
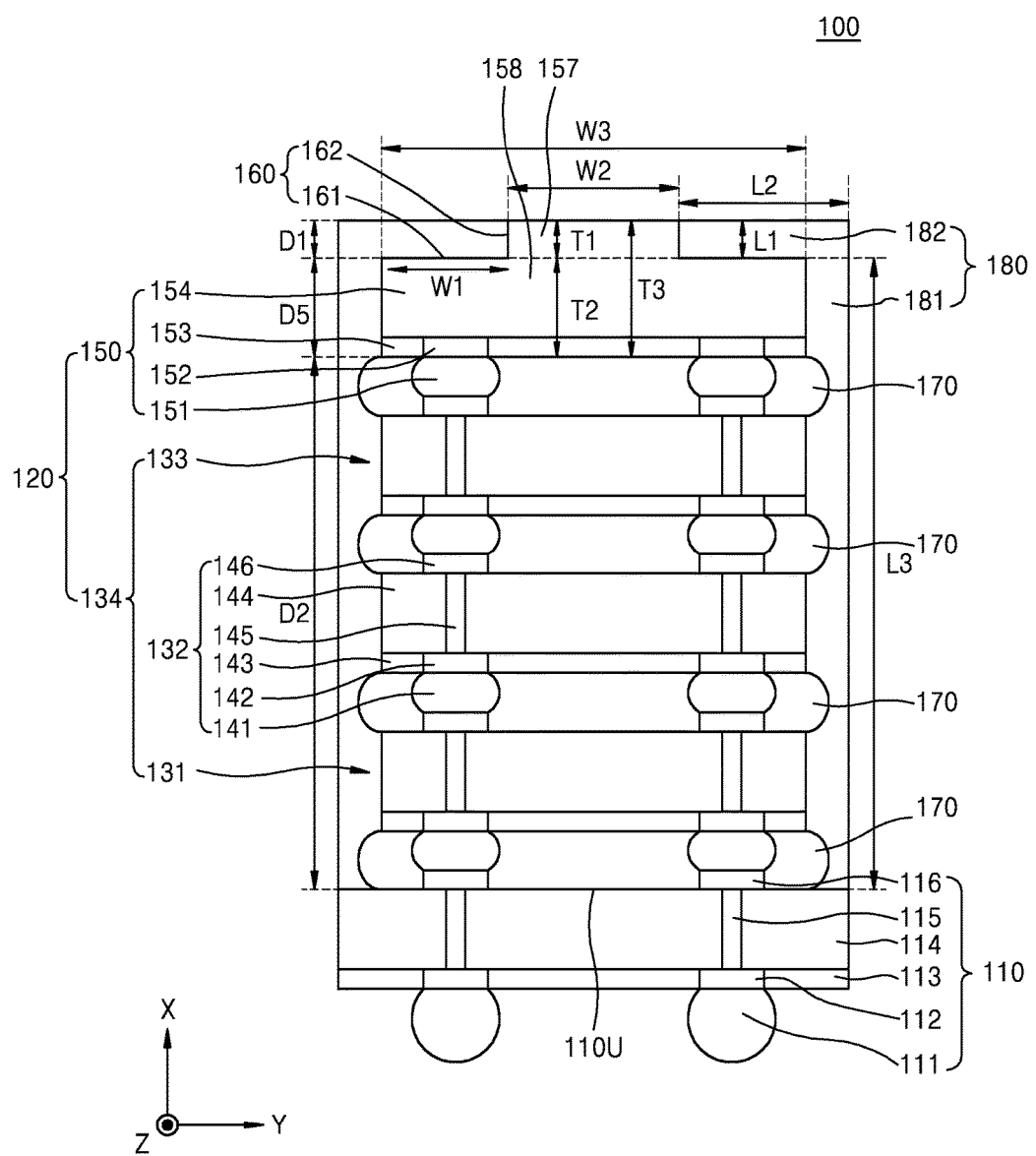
FIG. 1 is a cross-sectional view of a semiconductor device package according to an embodiment of the inventive concept.

FIG. 1 is a cross-sectional view of a semiconductor device package 100 according to an embodiment of the inventive concept.

Referring to FIG. 1, the semiconductor device package 100 according to the present embodiment may comprise a buffer layer 110, a plurality of semiconductor chips 120, a plurality of chip adhesion layers 170, and a chip sealing material 180.

The buffer layer 110 may have an upper surface 110U perpendicular to a first direction X. The upper surface 110U of the buffer layer 110 may be parallel to a second direction Y and a third direction Z. The buffer layer 110 may comprise a buffer layer body unit 114, buffer layer through silicon vias (TSVs) 115, a buffer layer insulating layer 113, buffer layer lower pads 112, buffer layer connection elements 111, and buffer layer upper pads 116.

The buffer layer 110 may be formed from an active wafer or an interposer substrate. The active wafer denotes a substrate on which a semiconductor chip may be formed like a silicon wafer. When the buffer layer 110 is formed from an active wafer, the buffer layer 110 may function as a memory device or a logic device.

When the buffer layer 110 is formed from an interposer substrate, the buffer layer body unit 114 may comprise silicon, glass, ceramic, or plastic. When the buffer layer 110 is formed from an active wafer, the buffer layer body unit 114 may comprise a semiconductor substrate (not shown), an integrated circuit layer (not shown), an interlayer insulating layer (not shown), a multi-layered interconnection layer (not shown), and an inter-metal insulating layer (not shown). The semiconductor substrate may comprise a IV group material wafer, such as a silicon wafer or a III-V group compound wafer. Also, the semiconductor substrate is not limited to a single crystal wafer, that is, the semiconductor substrate may be an epitaxial layer, a polished wafer, an annealed wafer, or a silicon-on-insulator (SOI).

The buffer layer TSVs 115 may penetrate through the buffer layer body unit 114. The buffer layer TSVs 115 may comprise, for example, a barrier layer (not shown) and an interconnection layer (not shown). The barrier layer may comprise at least one of, for example, Ti, Ta, TiN, and TaN. The interconnection layer may comprise at least one of, for example, Al, Au, Be, Bi, Co, Cu, Hf, In, Mn, Mo, Ni, Pb, Pd, Pt, Rh, Re, Ru, Ta, Te, Ti, W, Zn, and Zr. Also, a spacer layer (not shown) may be interposed between the buffer layer TSVs 115 and the buffer layer body unit 114. The spacer layer may prevent circuit elements in the buffer layer body unit 114 from directly contacting the buffer layer TSVs 115.

The buffer layer insulating layer 113 may be arranged on a lower surface of the buffer layer body unit 114. The buffer layer insulating layer 113 may comprise at least one of, for example, an oxide such as a silicon oxide, a nitride such as a silicon nitride, and an organic polymer.

The buffer layer lower pads 112 may be arranged on the lower surface of the buffer layer body unit 114. The buffer layer lower pads 112 may pass through the buffer layer insulating layer 113 and may be electrically connected to the buffer layer TSVs 115. In FIG. 1, it is depicted that the buffer layer lower pads 112 are directly connected to the buffer layer TSVs 115. However, the buffer layer lower pads 112 may be connected to the buffer layer TSVs 115 through an interconnection layer (not shown) of the buffer layer body unit 114. The buffer layer lower pads 112 may comprise a conductive material, for example, Ni, Al, Cu, Au, Ag, or W.

The buffer layer connection elements 111 may be arranged on lower ends of the buffer layer lower pads 112. The buffer layer connection elements 111 may comprise, for example, a solder bump, an Au bump, or a Cu pillar. The solder bump may comprise, for example, Pb—Sn or Sn—Cu—Ag. The buffer layer connection elements 111 may comprise a conductive material such as Cu, Al, Ag, Sn, Au, or a Pb—Sn solder. The buffer layer connection element 111 may comprise, for example, bump and under bump metal (UBM) (not shown) between the bump and the buffer layer lower pads 112. The UBM may be composed of a single layer or a multi-layer. For example, the UBM may comprise an adhesion layer (not shown) and a diffusion barrier layer (not shown). When the UBM is composed of a multi-layer, the UBM may comprise Cr/Cr—Cu/Cu, Ti/W/Cu, Ti/Cu, or Ti/W/Au.

The buffer layer upper pads 116 may be arranged on an upper surface of the buffer layer body unit 114. The buffer layer upper pads 116 may be electrically connected to the buffer layer TSVs 115. In FIG. 1, it is depicted as that the buffer layer upper pads 116 are directly connected to the buffer layer TSVs 115. However, the buffer layer upper pads 116 may be connected to the buffer layer TSVs 115 through an interconnection layer (not shown) of the buffer layer body unit 114. Similar to the buffer layer lower pads 112, the buffer layer upper pads 116 may comprise a conductive material such as Ni, Al, Cu, Au, Ag, or W.

The semiconductor chips 120 may be stacked one by one in the first direction X on the buffer layer 110. The semiconductor chips 120 and the buffer layer 110 may be electrically connected to each other. The semiconductor chips 120 may be stacked in a row on the buffer layer 110. Unlike in FIG. 1, according to some embodiments, the semiconductor chips 120 may be arranged in two or more rows on the buffer layer 110. The semiconductor chips 120 may comprise an upper semiconductor chip 150 which is the farthest semiconductor chip from the buffer layer 110 and a plurality of intermediate semiconductor chips 134 of the remaining semiconductor chips 120. In FIG. 1, it is depicted that the semiconductor chips 120 comprise four semiconductor chips including the first, second, and third intermediate semiconductor chips 131, 132 and 133 and the upper semiconductor chip 150, but the number of the semiconductor chips 120 is not limited thereto. For example, the semiconductor chips 120 may comprise eight or twelve semiconductor chips. When the semiconductor chips 120 comprise 8 semiconductor chips, the semiconductor chips 120 may comprise the upper semiconductor chip 150 and seven intermediate semiconductor chips 134.

Each of the semiconductor chips 120 may be a memory semiconductor chip or a logic semiconductor chip. For example, the first intermediate semiconductor chip 131 may be a logic semiconductor chip. The second and third intermediate semiconductor chips 132 and 133 and the upper semiconductor chip 150 may be memory semiconductor chips. The logic semiconductor chip may be a central processing unit (CPU), a controller, or an application specific integrated circuit (ASIC). The memory semiconductor chip may be dynamic random access memory (DRAM), SRAM, flash memory, electrically erasable programmable read-only memory (EEPROM), PRAM, MRAM, or RRAM.

Each of the intermediate semiconductor chips 134, similar to the buffer layer 110, may comprise an intermediate semiconductor chip body unit 144, intermediate semiconductor chip TSVs 145, an intermediate semiconductor chip insulating layer 143, intermediate semiconductor chip lower pads 142, intermediate semiconductor chip connection elements 141, and intermediate semiconductor chip upper pads 146.

The intermediate semiconductor chip body unit 144 may be formed not from an interposer substrate but from an active wafer. The intermediate semiconductor chip body unit 144 may comprise a semiconductor material, such as Si or Ge. The intermediate semiconductor chip TSVs 145 may penetrate through the intermediate semiconductor chip body unit 144. The intermediate semiconductor chip insulating layer 143 may be arranged on a lower surface of the intermediate semiconductor chip body unit 144. The intermediate semiconductor chip lower pads 142 may be arranged on the lower surface of the intermediate semiconductor chip body unit 144. The intermediate semiconductor chip lower pads 142 may pass through the intermediate semiconductor chip insulating layer 143 and may be electrically connected to the intermediate semiconductor chip TSVs 145. The intermediate semiconductor chip connection elements 141 may be arranged on a lower end of the intermediate semiconductor chip lower pads 142. The intermediate semiconductor chip connection elements 141 may be electrically connected to the buffer layer upper pads 116 or one of the intermediate semiconductor chip upper pads 146 of other intermediate semiconductor chips 134. For example, the intermediate semiconductor chip connection elements 141 of the second intermediate semiconductor chip 132 may be electrically connected to the intermediate semiconductor chip upper pads 146 of the first intermediate semiconductor chip 131. The intermediate semiconductor chip upper pads 146 may be arranged on an upper surface of the intermediate semiconductor chip body unit 144. The intermediate semiconductor chip upper pads 146 may be electrically connected to the intermediate semiconductor chip TSVs 145. Structures and constituent materials for the intermediate semiconductor chip TSVs 145, the intermediate semiconductor chip insulating layer 143, the intermediate semiconductor chip lower pads 142, the intermediate semiconductor chip connection elements 141, and the intermediate semiconductor chip upper pads 146 respectively may be the same as the structures and constituent materials for the buffer layer TSVs 115, the buffer layer insulating layer 113, the buffer layer lower pads 112, the buffer layer connection elements 111, and the buffer layer upper pads 116, and thus, the descriptions thereof will be omitted.

The upper semiconductor chip 150 has a structure similar to that of the intermediate semiconductor chips 134, thus, the differences therebetween will be described. The upper semiconductor chip 150 may not comprise an upper semiconductor chip TSV and an upper semiconductor chip upper pad. That is, the upper semiconductor chip 150 may comprise an upper semiconductor chip body unit 154, an upper semiconductor chip insulating layer 153, upper semiconductor chip lower pads 152, and upper semiconductor chip connection elements 151. The upper semiconductor chip connection elements 151 may be electrically connected to the intermediate semiconductor chip upper pads 146 of the uppermost one of the intermediate semiconductor chips 134. For example, the upper semiconductor chip connection elements 151 may be electrically connected to the intermediate semiconductor chip upper pads 146 of the third intermediate semiconductor chip 133. A thickness T3 of the upper semiconductor chip 150 in the first direction X may be different from at least one of thicknesses in the first direction of each of the intermediate semiconductor chips 134.

A trench 160 may be formed in at least a portion of periphery of an upper portion of the upper semiconductor chip 157. The trench 160 may have a trench lower surface 161 and a trench side surface 162. A maximum width W1 of the trench 160 in the second direction Y may be greater than a minimum depth D1 of the trench 160 in the first direction X. When the maximum width W1 of the trench 160 in the second direction Y is greater than the minimum depth D1 of the trench 160 in the first direction X, a space for accommodating a circuit may be secured in the upper semiconductor chip body unit 154, and also, a contact area between the upper semiconductor chip 150 and the chip sealing material 180 may be increased. The minimum depth D1 of the trench 160 in the first direction X may be less than a distance D2 in the first direction from the buffer layer 110 to a lower surface of the upper semiconductor chip 150. A minimum distance D5 in the first direction X from the lower surface of the upper semiconductor chip 150 to a lower end of the trench 160 may be less than the distance D2 in the first direction X from the buffer layer 110 to the lower surface of the upper semiconductor chip 150. Here, it may be understood that the lower surface of the upper semiconductor chip 150 indicates a lower surface of the upper semiconductor chip insulating layer 153 of the upper semiconductor chip 150. That is, the distance D2 in the first direction from the buffer layer 110 to the lower surface of the upper semiconductor chip 150 may denote a minimum distance from the upper surface 110U of the buffer layer 110 to the lower surface of the upper semiconductor chip insulating layer 153. Also, the minimum distance D5 in the first direction X from the lower surface of the upper semiconductor chip 150 to the trench lower surface 161 of the trench 160 may denote a minimum distance in the first direction X from the lower surface of the upper semiconductor chip insulating layer 153 to the lower end of the trench 160.

The upper semiconductor chip 150 may comprise an upper portion of the upper semiconductor chip 157 and a lower portion of the upper semiconductor chip 158. A maximum width W2 of the upper portion of the upper semiconductor chip 157 in the second direction Y may be less than a maximum width W3 of the lower portion of the upper semiconductor chip 158 in the second direction Y. A boundary between the upper portion of the upper semiconductor chip 157 and the lower portion of the upper semiconductor chip 158 may be located at the same height as the trench lower surface 161 of the trench 160. That is, a minimum thickness T1 of the upper portion of the upper semiconductor chip 157 in the first direction X may be equal to the minimum depth D1 of the trench 160 in the first direction X. A width difference between the maximum width W2 of the upper portion of the upper semiconductor chip 157 in the second direction Y and the maximum width W3 of the lower portion of the upper semiconductor chip 158 in the second direction Y may be greater than the minimum thickness T1 of the upper portion of the upper semiconductor chip 157 in the first direction X. The minimum thickness T1 of the upper portion of the upper semiconductor chip 157 in the first direction X may be less than a distance D2 in the first direction X from the buffer layer 110 to the lower surface of the upper semiconductor chip 150. The minimum thickness T2 of the lower portion of the upper semiconductor chip 158 in the first direction X may be less than a distance D2 in the first direction X from the buffer layer 110 to the lower surface of the upper semiconductor chip 150.

A plurality of chip adhesion layers 170 respectively may be arranged between the buffer layer 110 and the semiconductor chips 120 and between the semiconductor chips 120. That is, each of the chip adhesion layers 170 may be arranged between the buffer layer 110 and the first intermediate semiconductor chip 131, between the first intermediate semiconductor chip 131 and the second intermediate semiconductor chip 132, between the second intermediate semiconductor chip 132 and the third intermediate semiconductor chip 133, and between the third intermediate semiconductor chip 133 and the upper semiconductor chip 150 one by one. According to some embodiments, each of the chip adhesion layers 170 may comprise a non-conductive adhesive including a polymer resin. According to other embodiments of the inventive concept, each of the chip adhesion layers 170 may be an anisotropic conductive adhesive or an isotropic conductive adhesive including conductive particles and polymer resin. The anisotropic conductive adhesive, the isotropic conductive adhesive, and the non-conductive adhesive respectively may be a film type or a paste type. The conductive particles may comprise, for example, Ni, Au, Ag, or Cu. The polymer resin may comprise, for example, a thermosetting resin, a thermo-plastic resin, or an ultraviolet (UV) curable resin. Each of the chip adhesion layers 170 may comprise, for example, an epoxy resin, a urethane resin, or an acryl resin.

The chip sealing material 180 may surround the upper surface 110U of the buffer layer 110 and sidewalls of the semiconductor chips 120. That is, the chip sealing material 180 may surround the upper surface 110U of the buffer layer 110, sidewalls of the intermediate semiconductor chips 134, and sidewalls of the upper semiconductor chip 150. The chip sealing material 180 may also surround sidewalls of the upper portion of the upper semiconductor chip 157 and the lower portion of the upper semiconductor chip 158. The chip sealing material 180 may cover the trench 160 formed in a periphery of the upper portion of the upper semiconductor chip 157. That is, the chip sealing material 180 may cover the trench side surface 162 and the trench lower surface 161. The chip sealing material 180 may not cover an upper surface of the upper semiconductor chip 150. The chip sealing material 180 may comprise a thermosetting resin, a thermo-plastic resin, or an UV curable resin. The chip sealing material 180 may comprise, for example, an epoxy resin, such as epoxy mold compound (EMC) or a silicon resin.

The chip sealing material 180 may comprise a sidewall portion 181 and a protrusion portion 182 arranged on an upper end of the sidewall portion 181. The sidewall portion 181 extends in the first direction X and may surround the sidewalls of the semiconductor chips 120 and the sidewalls of the chip adhesion layers 170. The protrusion portion 182 may protrude from an outside of the upper semiconductor chip 150 towards an inner side of the upper semiconductor chip 150. The protrusion portion 182 may surround a portion of a periphery or a whole periphery of the upper semiconductor chip 150. The protrusion portion 182 may cover the trench 160 and may not cover the upper surface of the upper semiconductor chip 150. That is, the protrusion portion 182 may cover the trench lower surface 161 and the trench side surface 162. Upper surfaces of the protrusion portion 182 and the upper surface of the upper semiconductor chip 150 may be coplanar. A boundary between the sidewall portion 181 and the protrusion portion 182 may be located at the same level with the trench lower surface 161. That is, a minimum length L1 of the protrusion portion 182 in the first direction X may be equal to a minimum depth D1 of the trench 160 in the first direction X. The boundary between the sidewall portion 181 and the protrusion portion 182 may be located at the same level with a boundary between the upper portion of the upper semiconductor chip 157 and the lower portion of the upper semiconductor chip 158. That is, the minimum length L1 of the protrusion portion 182 in the first direction X may be equal to the thickness T1 of the upper portion of the upper semiconductor chip 157. A maximum length L2 of the protrusion portion 182 in the second direction Y may be greater than the minimum length L1 of the protrusion portion 182 in the first direction X. When the maximum length L2 of the protrusion portion 182 in the second direction Y is greater than the minimum length L1 of the protrusion portion 182 in the first direction X, a space for accommodating a circuit may be secured in the upper semiconductor chip body unit 154, and a contact area between the upper semiconductor chip 150 and the chip sealing material 180 may be increased. The minimum length L1 of the protrusion portion 182 in the first direction X may be less than a length L3 of the sidewall portion 181 in the first direction X.

According to embodiments of the inventive concept, the trench 160 is formed in the outer periphery of the upper portion of the upper semiconductor chip 157, and thus, a contact area between the upper semiconductor chip 150 and the chip sealing material 180 may be increased. That is, since the protrusion portion 182 covers the trench lower surface 161 and the trench side surface 162, a contact area between the upper semiconductor chip 150 and the chip sealing material 180 may be increased when compared to a case where the trench 160 is not formed. As a result of the increased contact area, adhesion between the upper semiconductor chip 150 and the chip sealing material 180 may be reinforced. Accordingly, although a warpage occurs on the semiconductor device package 100, an occurrence of a gap between the upper semiconductor chip 150 and the chip sealing material 180 may be prevented. Also, an occurrence of cracks on the chip sealing material 180 or the upper semiconductor chip 150 due to a disconnection of the adhesion between the chip sealing material 180 and the upper semiconductor chip 150 may be prevented. Accordingly, the reliability of the semiconductor device package 100 may be improved.

Although not shown in FIG. 1, the semiconductor device package 100 according to an embodiment may further comprise a substrate (not shown) under the buffer layer 110. The substrate may also be formed from an active wafer or an interposer substrate. Also, the semiconductor device package 100 may further comprise an external sealing material (not shown) covering an upper surface of the substrate, sidewalls of the buffer layer 110, and sidewalls of the chip sealing material 180. The external sealing material may comprise, for example, a thermosetting resin, a thermoplastic resin, or an UV curable resin. The external sealing material and the chip sealing material 180 may comprise the same material or different materials from each other.

Figure 2:
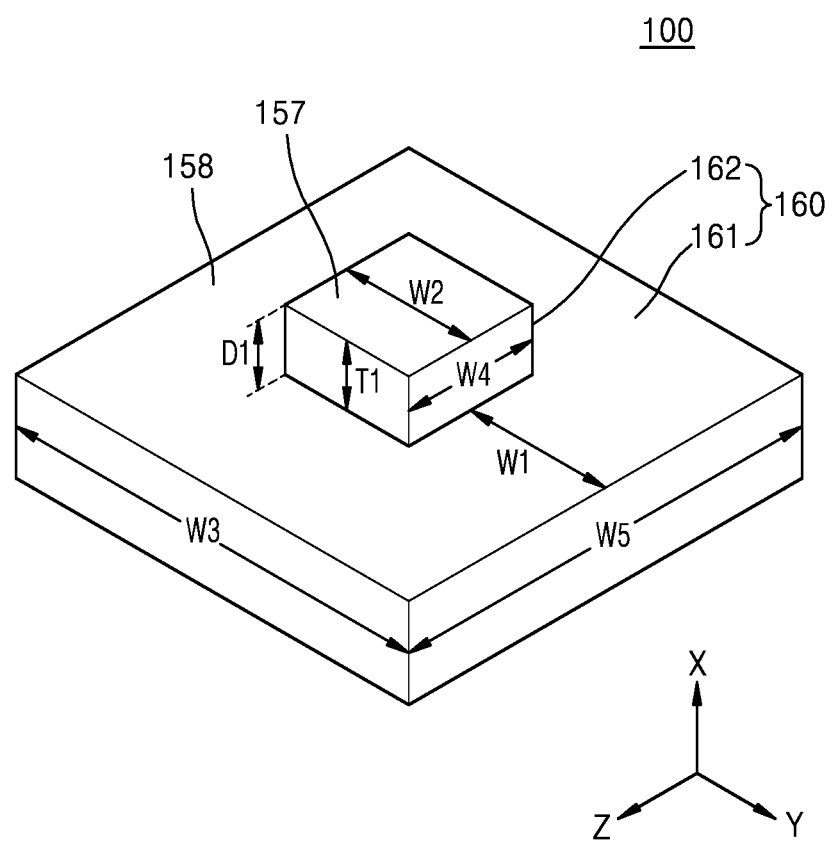
FIG. 2 is a magnified perspective view of an upper semiconductor chip in the semiconductor device package according to an embodiment of the inventive concept.

FIG. 2 is a magnified perspective view of the upper portion of the upper semiconductor chip 157 included in the semiconductor device package 100 according to an embodiment of the inventive concept.

Referring to FIG. 2, the trench 160 may be formed along an entire surface of the upper portion of the upper semiconductor chip 157. That is, in all directions perpendicular to the first direction X, the maximum width W2 of the upper portion of the upper semiconductor chip 157 may be less than the maximum width W3 of the lower portion of the upper semiconductor chip 158. For example, a maximum width W4 of the upper portion of the upper semiconductor chip 157 in the third direction Z that is perpendicular to the first direction X may also be less than the maximum width W5 of the lower portion of the upper semiconductor chip 158 in the third direction Z. In this case, the protrusion portion 182 (refer to FIG. 1) may be formed to surround an entire periphery of the upper portion of the upper semiconductor chip 157. In FIG. 2, it is depicted that the maximum width W2 of the upper portion of the upper semiconductor chip 157 in the second direction Y is less than the maximum width W1 of the trench 160 in the second direction Y. However, the maximum width W2 of the upper portion of the upper semiconductor chip 157 in the second direction Y may be greater than the maximum width W1 of the trench 160 in the second direction.

FIGS. 3A through 3G are cross-sectional views of semiconductor device packages 300A through 300G according to some embodiments of the inventive concept. In the semiconductor device packages 300A through 300G of FIGS. 3A through 3G, the shapes of the trench 160 and the protrusion portion 182 of the chip sealing material 180 are different from those of the trench 160 and the protrusion portion 182 of the chip sealing material 180 of FIG. 1. Thus, hereinafter, the differences will be described.

Figure 3A:
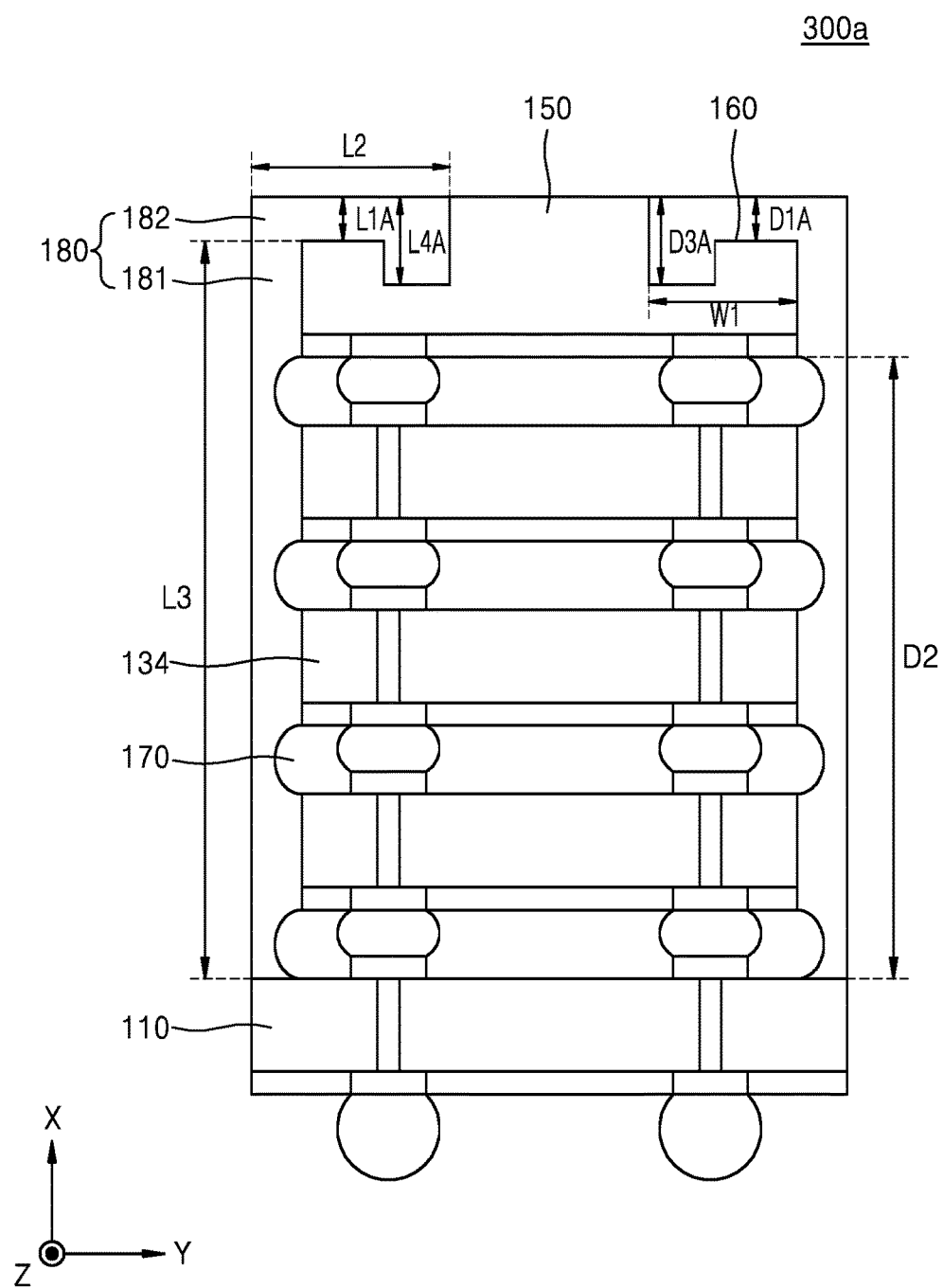
FIGS. 3A through 3G are cross-sectional views of semiconductor device packages according to some embodiments of the inventive concept.

Referring to FIG. 3A, the protrusion portion 182 may have a hook shape or an inverted L shape. That is, a portion of the protrusion portion 182 close to the sidewall portion 181 may have a minimum length L1A in the first direction, and a portion of the protrusion portion 182 away from the sidewall portion 181 may have a maximum length L4A in the first direction X. In a view from the trench 160, depths of the trench 160 in the first direction X may not be constant. A portion of the trench 160 close to the center of the upper semiconductor chip 150 may have a maximum depth D3A, and a portion of the trench 160 away from the center of the upper semiconductor chip 150 may have a minimum depth D1A.

Figure 3B:
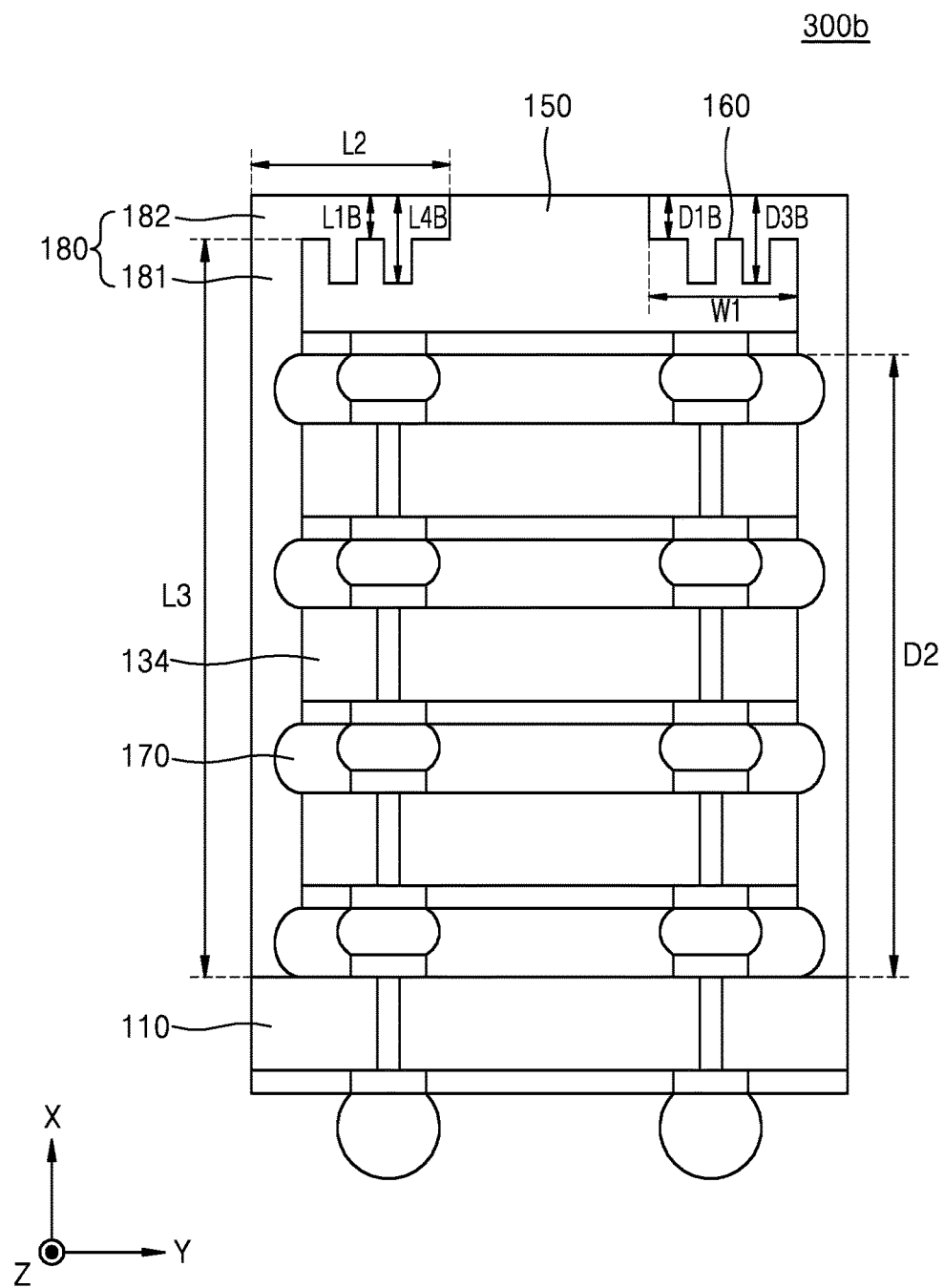

Referring to FIG. 3B, the protrusion portion 182 may have a corrugated shape. The protrusion portion 182 may comprise portions having a maximum length L4B in the first direction X and portions having minimum length L1B in the second direction Y. In a view from the trench 160, the trench 160 may comprise portions having a maximum depth D3B and portions having a minimum depth D1B.

Figure 3C:
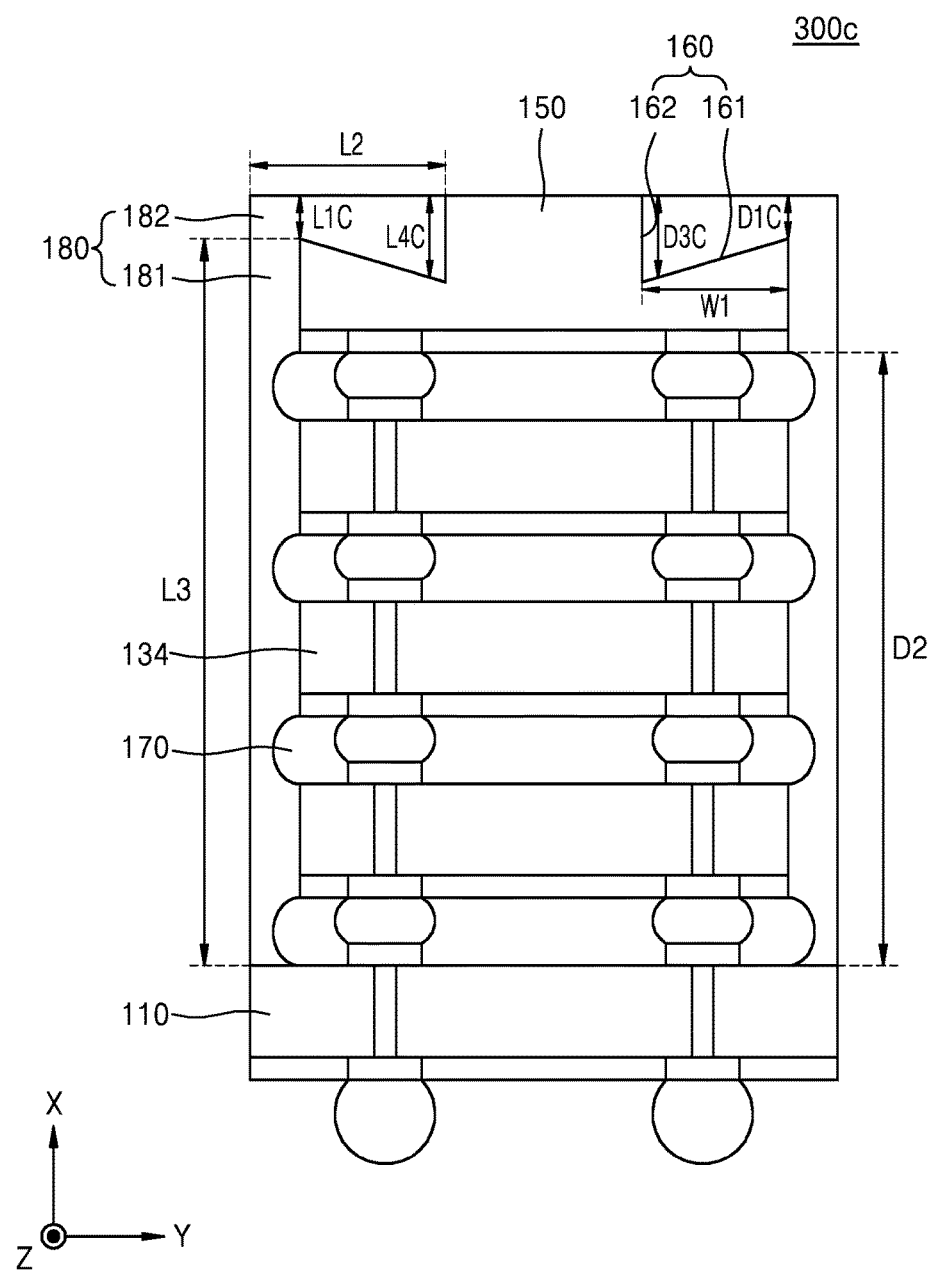
Figure 3D:
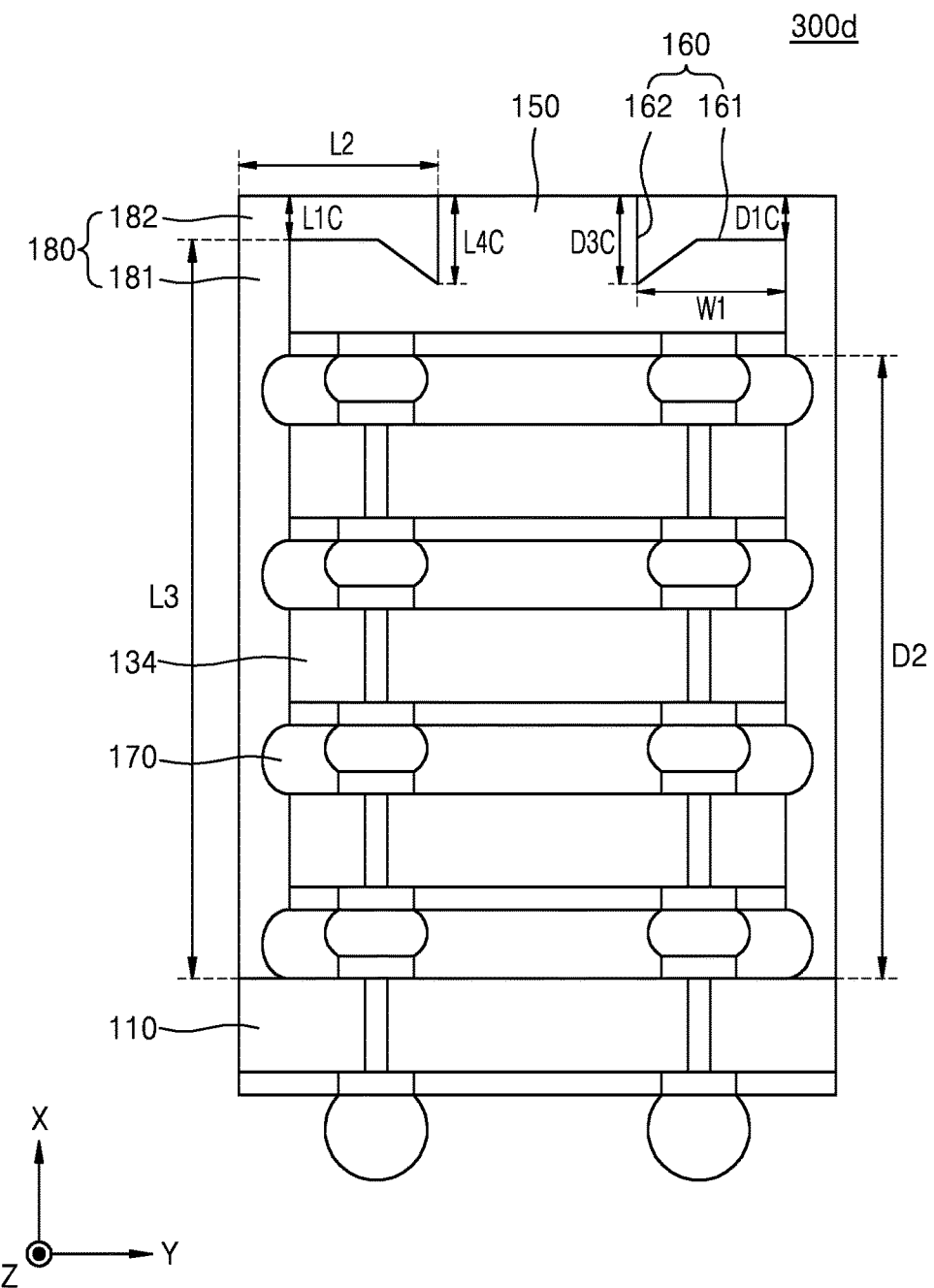

Referring to FIGS. 3C and 3D, the trench lower surface 161 may not be substantially perpendicular to the first direction X. For example, as in FIG. 3C, the trench lower surface 161 may have an angle with respect to the first direction X other than the right angle. As depicted in FIG. 3D, a portion of the trench lower surface 161 may be substantially perpendicular to the first direction X, and the other portion of the trench lower surface 161 may not be substantially perpendicular to the first direction X. as depicted in FIGS. 3C and 3D, the trench 160 may have a maximum depth D3C in the first direction X at a location close to the center of the upper semiconductor chip 150 and may have a minimum depth D1C in the first direction X at a location away from the center of the upper semiconductor chip 150. From a view point of the protrusion portion 182, the protrusion portion 182 may have a maximum length L4C in the first direction X at a location away from the sidewall portion 181, and may have a minimum length L1C in the first direction X at a location close to the sidewall portion 181.

Figure 3E:
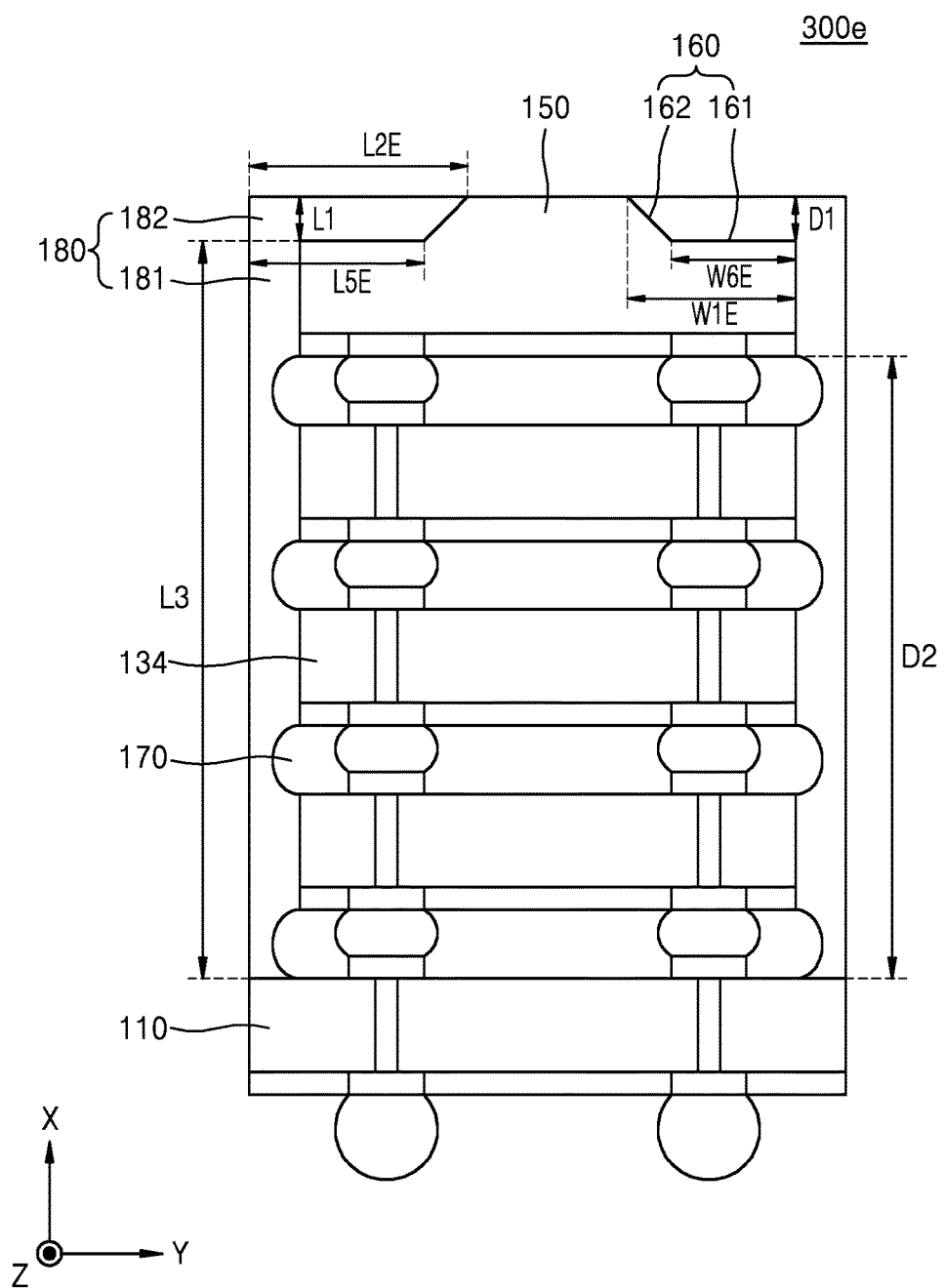
Figure 3F:
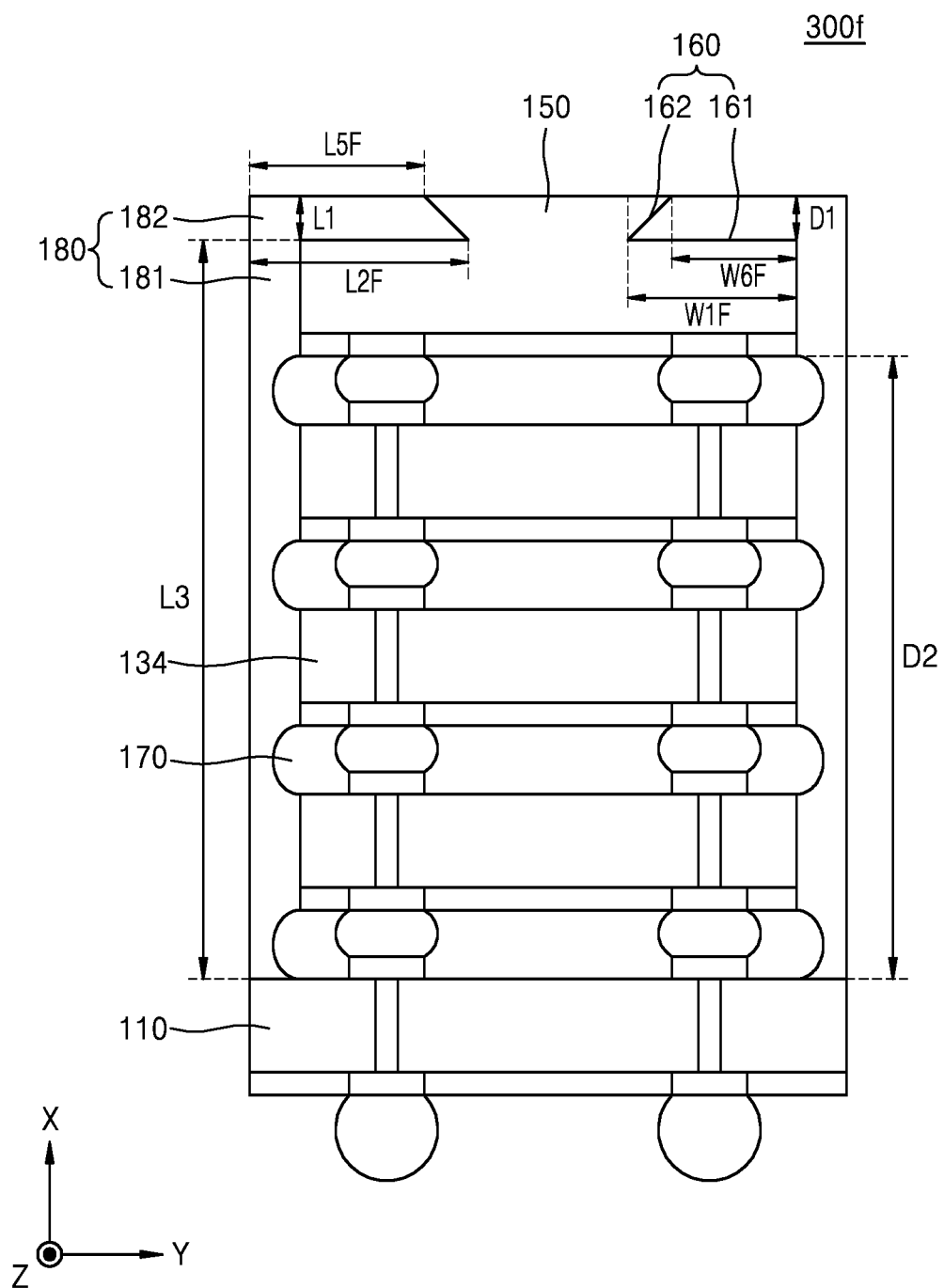

Referring to FIGS. 3E and 3F, the trench side surface 162 may not substantially parallel to the first direction X. That is, a width of the trench 160 in the second direction Y may vary according to locations in the first direction X. For example, as depicted in FIG. 3E, the trench 160 may have a minimum width W6E in the second direction Y at a lower end of the trench 160, and a maximum width W1E in the second direction at an upper end of the trench 160. From a view point of the protrusion portion 182, the protrusion portion 182 may have a minimum length L5E in the second direction Y at a lower end of the protrusion portion 182, and may have a maximum length L2E in the second direction Y at an upper end of the protrusion portion 182. However, as depicted in FIG. 3F, the trench 160 may have a minimum width W6F in the second direction Y at an upper end of the trench 160, and may have a maximum width W1F in the second direction Y at a lower end of the trench 160. From a view point of the protrusion portion 182, the protrusion portion 182 may have a minimum length L5E in the second direction Y at an upper end of the protrusion portion 182, and may have a maximum length L2E in the second direction Y at a lower end of the protrusion portion 182.

Figure 3G:
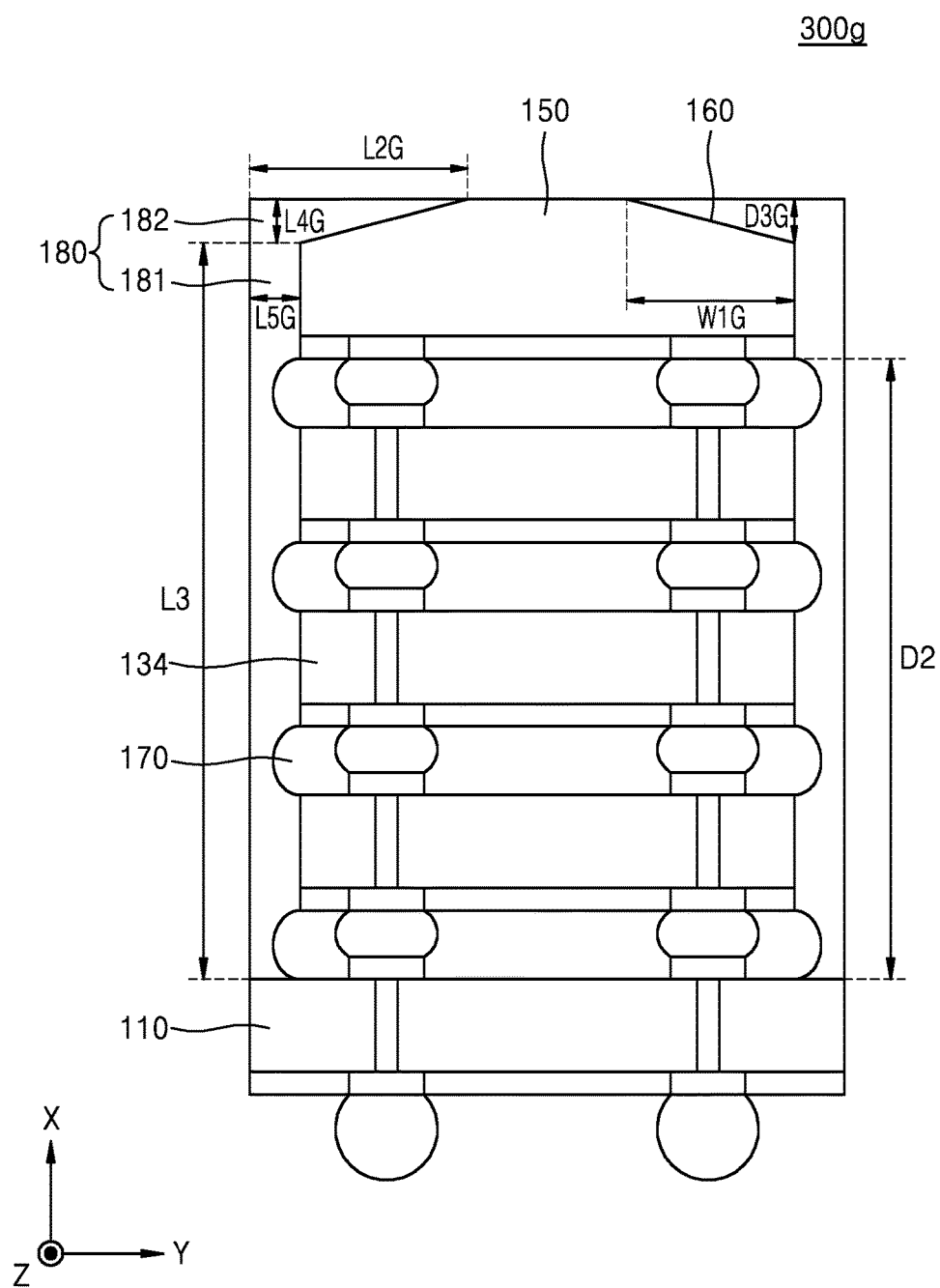

Referring to FIG. 3G, the trench 160 may comprise a sloped surface instead of the trench lower surface 161 and the trench side surface 162. The sloped surface may not be substantially perpendicular to the first direction X. In this case, a depth of the trench 160 may vary according to locations in the second direction Y, and a width of the trench 160 may vary according to locations in the first direction X. The trench 160 may have a maximum depth D3G in the first direction X at a location away from the center of the upper semiconductor chip 150 in the second direction Y, and may have a maximum width W1G at an upper end of the trench 160 in the second direction Y. In the present embodiment, a minimum depth in the first direction X and a minimum width in the second direction Y of the trench 160 may not be defined. From a view point of the protrusion portion 182, the farther from the sidewall portion 181, the shorter the length of the protrusion portion 182 in the first direction X. Accordingly, the protrusion portion 182 may have a maximum length L4G in the first direction X at a location close to the sidewall portion 181. Also, the protrusion portion 182 may have a maximum length L2G in the second direction Y at an upper end of the protrusion portion 182, and may have a minimum length L5G in the second direction Y at a lower end of the protrusion portion 182. In the present embodiment, a minimum length of the protrusion portion 182 in the first direction X may not be defined.

Figure 4A:
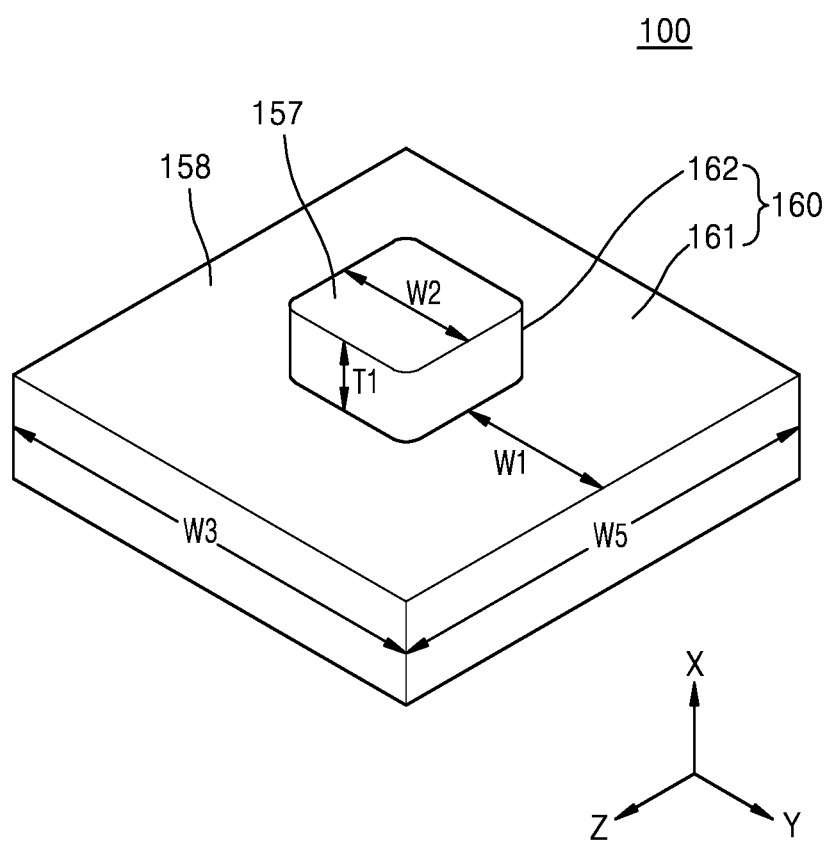
FIGS. 4A through 4C are magnified perspective views of upper semiconductor chips in the semiconductor device packages according to some embodiments of the inventive concept.
Figure 4B:
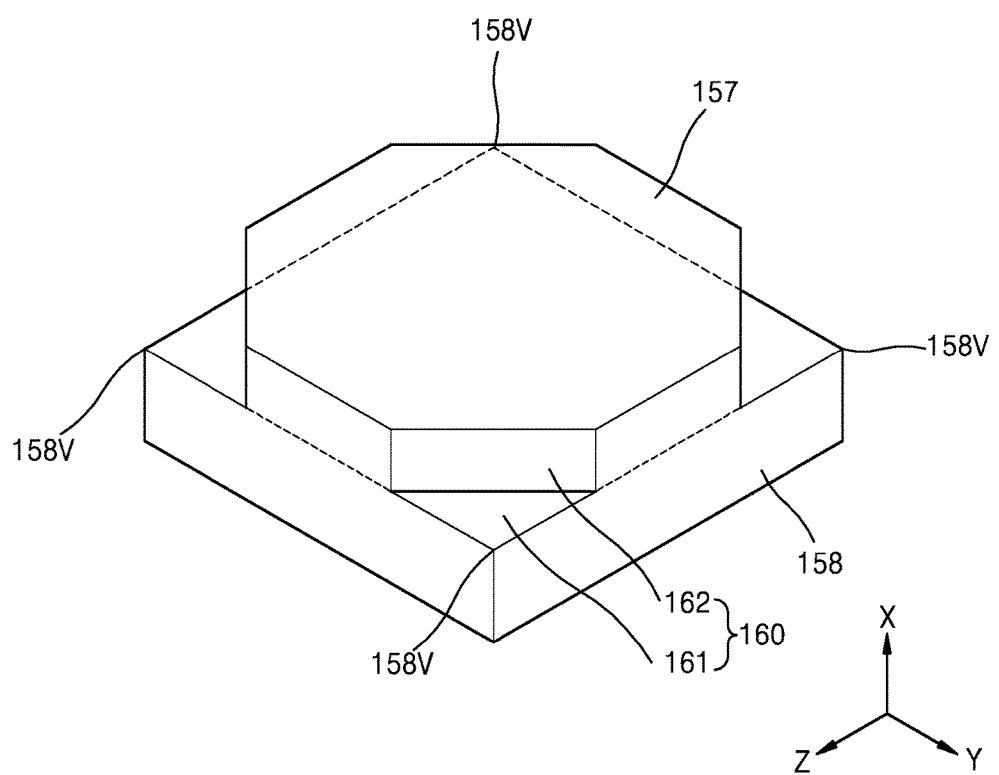
Figure 4C:
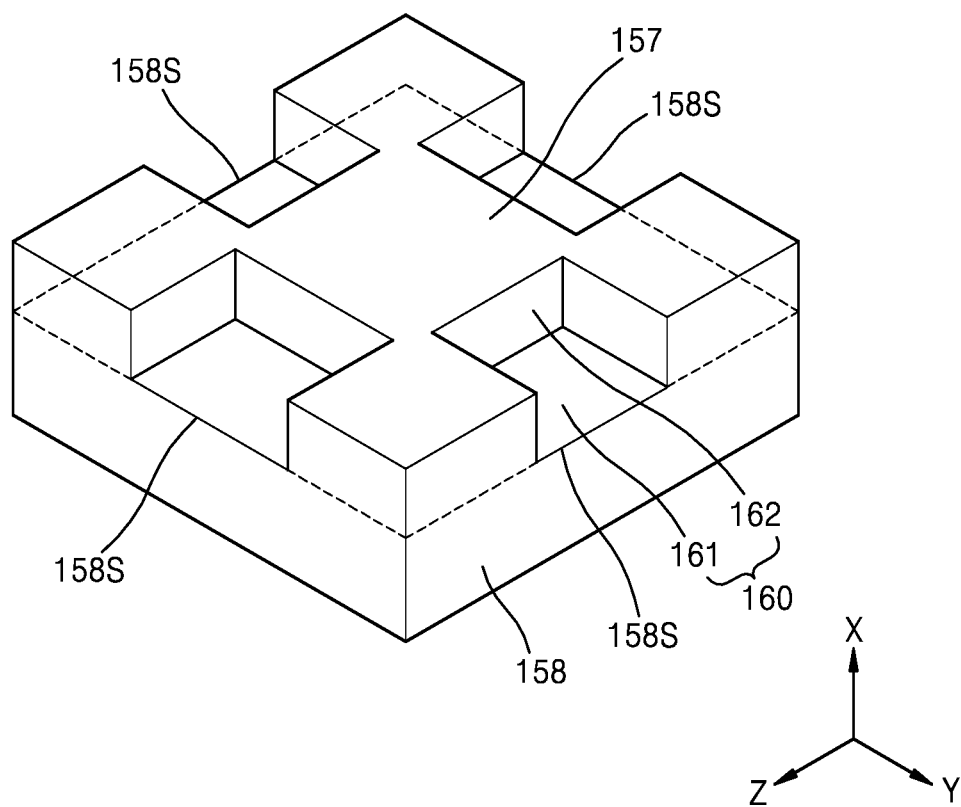

FIGS. 4A through 4C are magnified perspective views of upper semiconductor chips included in the semiconductor device packages 100 according to some embodiments of the inventive concept. In FIGS. 4A through 4C, various modified examples of the shape of the trench 160 of FIG. 2 are shown. Hereinafter, differences from the shape of the trench 160 of FIG. 2 will be described.

Referring to FIG. 4A, the trench 160 may be formed so that a cross-section of the upper portion of the upper semiconductor chip 157 perpendicular to the first direction X has a rounded rectangular shape. That is, according to the present embodiment, the trench side surface 162 may have both a flat portion and a curved portion. According to some embodiments, unlike in FIG. 4A, the trench side surface 162 may be a curved surface so that the cross-section of the upper portion of the upper semiconductor chip 157 perpendicular to the first direction X is circular. According to some embodiments, unlike in FIG. 4A, the trench lower surface 161 may have a curved surface.

Referring to FIGS. 4B and 4C, the trench 160 may be formed only in some portions of a periphery of the upper portion of the upper semiconductor chip 157. For example, referring to FIG. 4B, the trench 160 may be formed on at least one vertex 158V of four vertexes 158V of the lower portion of the upper semiconductor chip 158. In this case, the protrusion portion 182 (refer to FIG. 1) may be arranged on at least one vertex 158V of the four vertexes 158V of the lower portion of the upper semiconductor chip 158. Referring to FIG. 4C, the trench 160 may be formed on at least one side 158S of four sides 158S of the lower portion of the upper semiconductor chip 158. In this case, the protrusion portion 182 may be formed on at least one side 158S of the four sides 158S of the lower portion of the upper semiconductor chip 158.

Various modified embodiments of the shapes of the trench 160 and the protrusion portion 182 have been described with reference to FIGS. 3A through 4C. However, the shapes of the trench 160 and the protrusion portion 182 according to the present embodiment are not limited to the above descriptions. Through the control of the shapes and sizes of the trench 160 and the protrusion portion 182, the bonding between the upper semiconductor chip 150 and the chip sealing material 180 may be reinforced and warpage of the semiconductor device packages 300A through 300G may be reduced. As a result, the reliability of the semiconductor device packages 300A through 300G may be improved.

FIGS. 5A through 5I are schematic cross-sectional views for explaining a method of manufacturing a semiconductor device package 100 according to an embodiment of the inventive concept.

Figure 5A:
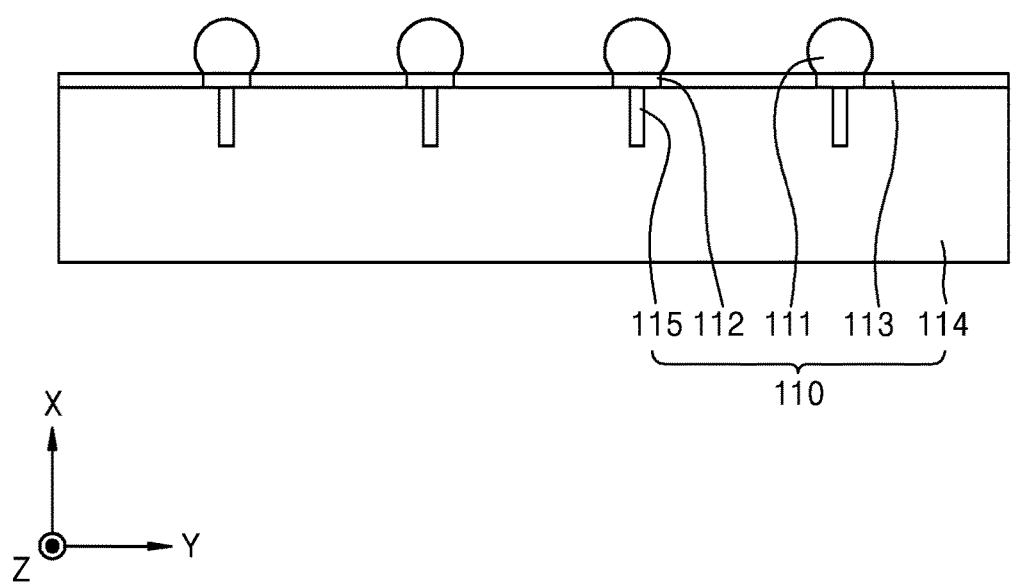
FIGS. 5A through 5I are schematic cross-sectional views for explaining a method of manufacturing a semiconductor device package according to an embodiment of the inventive concept.

Referring to FIG. 5A, the buffer layer 110 comprising the buffer layer TSVs 115, the buffer layer insulating layer 113, the buffer layer lower pads 112, the buffer layer connection elements 111, and the buffer layer body unit 114 is prepared. For example, the buffer layer lower pads 112 may be formed by using a sputtering process. The buffer layer connection elements 111 may be formed by using a sputtering process, a plating process, or an adhesion process. For example, after forming an UBM (not shown) on the buffer layer lower pads 112 by using a sputtering process and locating solder balls or solder paste on the UBM, the buffer layer connection elements 111 may be formed through a reflow process. As another example, the buffer layer connection elements 111 may be formed by plating a bump material, such as Au or Cu on the UBM.

Figure 5B:
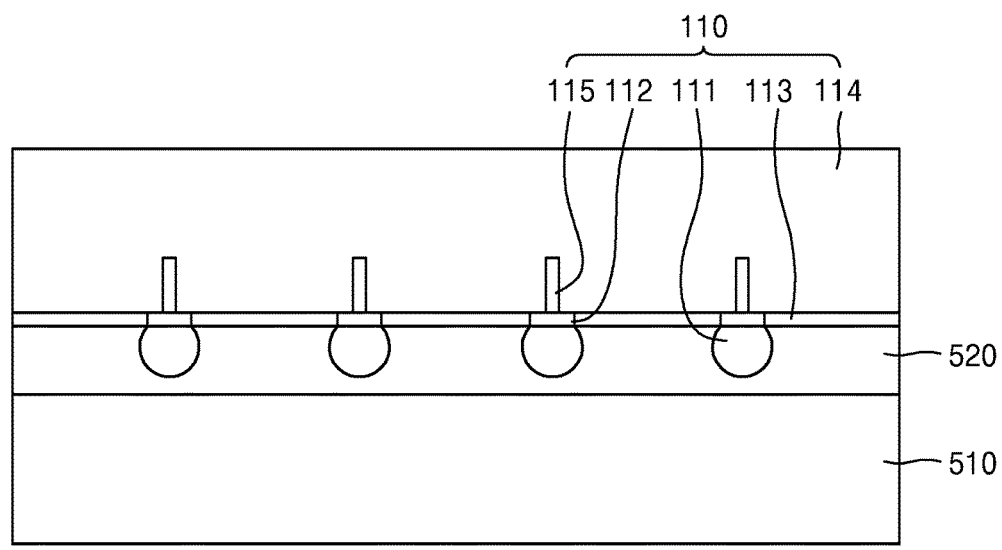

Referring to FIG. 5B, the buffer layer 110 may be attached to a carrier 510 through a carrier adhesive layer 520. The buffer layer 110 may be attached to the carrier 510 so that a surface of the buffer layer 110 on which the buffer layer lower pads 112 and the buffer layer connection elements 111 are formed to face the carrier 510. The carrier 510 may comprise, for example, glass, plastic, ceramic, or semiconductor such as silicon or germanium. The carrier adhesive layer 520 may comprise a thermosetting resin, a thermoplastic resin, or an UV curable resin. The carrier adhesive layer 520 may comprise an epoxy resin, a urethane resin, or an acryl resin.

Figure 5C:
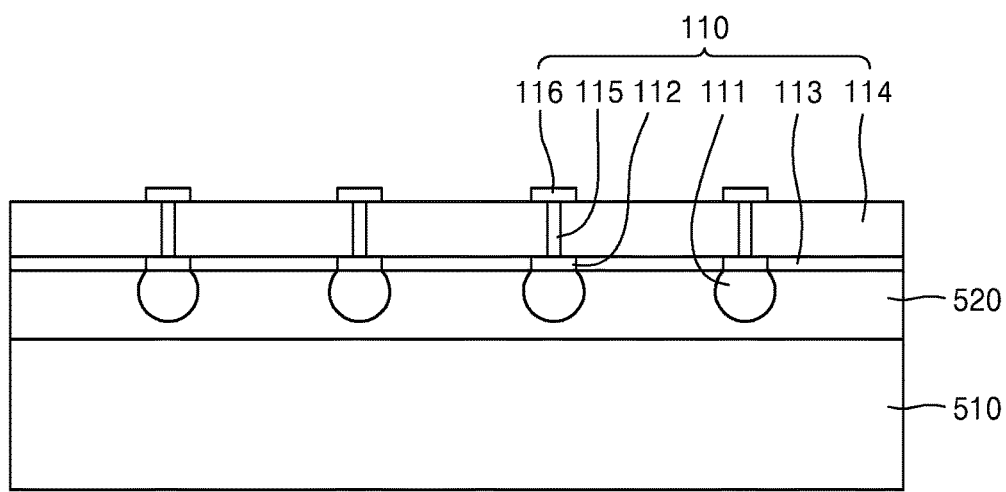

Referring to FIG. 5C, the buffer layer 110 is polished until the buffer layer TSVs 115 is exposed. Afterwards, the buffer layer upper pads 116 electrically connected to the buffer layer TSVs 115 are formed. The buffer layer upper pads 116 may be formed by using, for example, a sputtering process or a plating process.

Figure 5D:
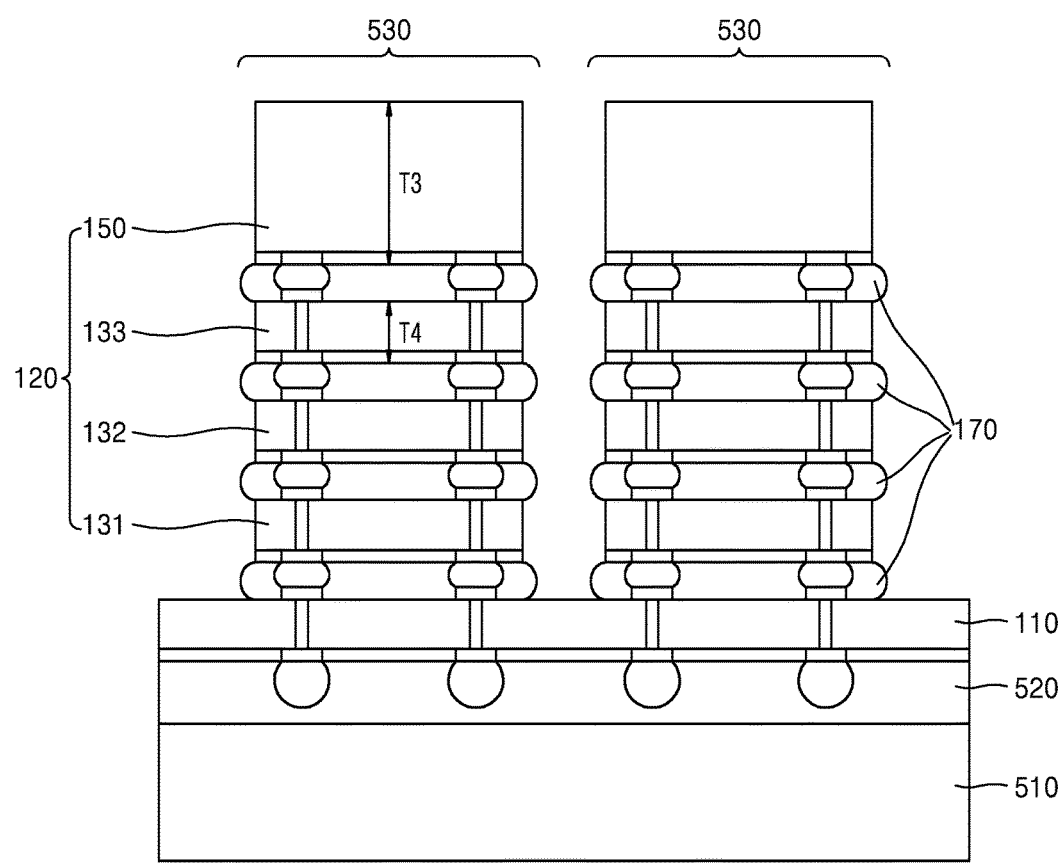

Referring to FIG. 5D, a plurality of the semiconductor chips 120 and a plurality of the chip adhesion layers 170 are formed on the buffer layer 110. The semiconductor chips 120 and the chip adhesive layers 170 may form the semiconductor chip stack 530. A plurality of semiconductor chip stacks 530 may be formed on the buffer layer 110. For example, as depicted in FIG. 5D, two semiconductor chip stacks 530 may be formed on the carrier 510. However, according to an embodiment, the number of the semiconductor chip stacks 530 formed on the buffer layer 110 may be much greater than 2. Unlike the first, second, and third intermediate semiconductor chips 131, 132, and 133, the upper semiconductor chip 150 is not thinned or is lesser thinned, and thus, the upper semiconductor chip 150 may have a thickness greater than that of the first, second, and third intermediate semiconductor chips 131, 132, and 133. For example, the upper semiconductor chip 150 may have a thickness T3 in a range from about 100 μm to about 1000 μm, and the first, second, and third intermediate semiconductor chips 131, 132, and 133 respectively may have a thickness T4 in a range from about 10 μm to about 100 μm.

Figure 5E:
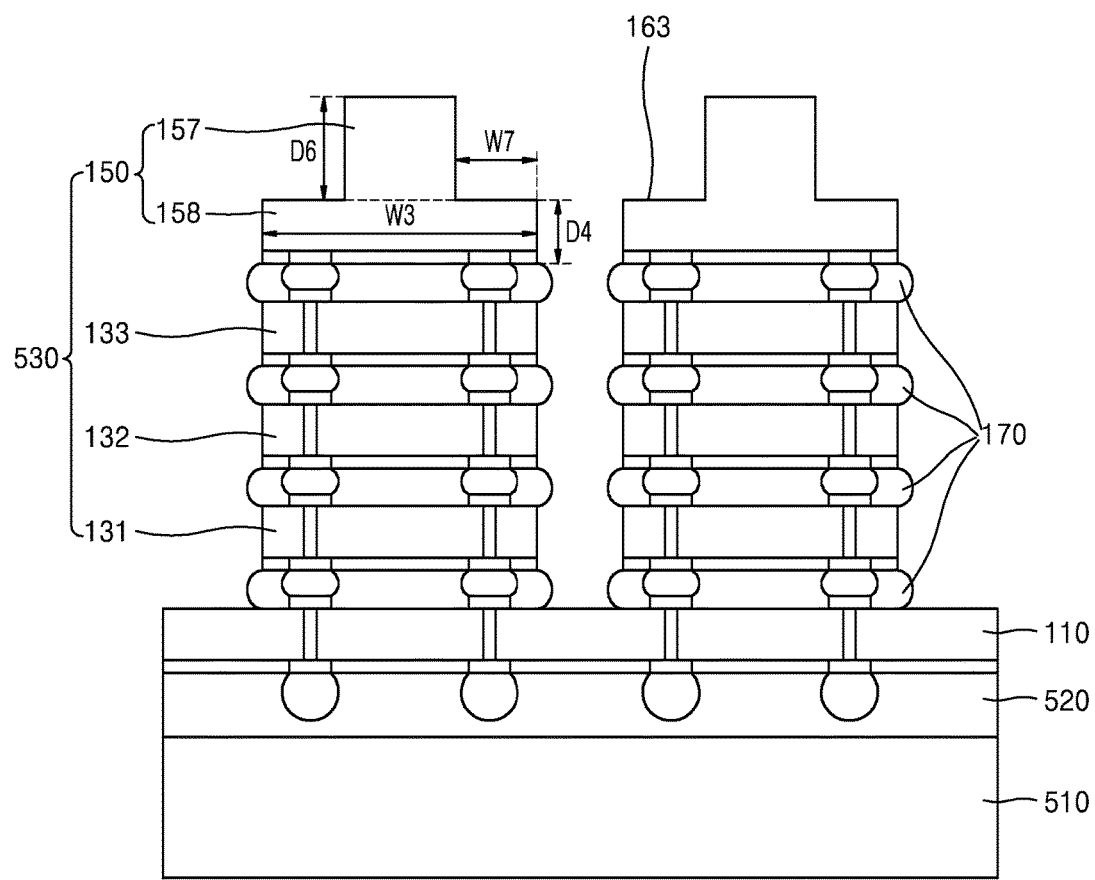

Referring to FIG. 5E, a provisional trench 163 may be formed in a periphery of the upper portion of the upper semiconductor chip 157. The provisional trench 163 may be formed, for example, by using a laser cutting process or a saw cutting process. The provisional trench 163 may be formed along an entire periphery of the upper portion of the upper semiconductor chip 157 or along a portion of the periphery of the upper portion of the upper semiconductor chip 157. A shape of the provisional trench 163 is not limited to the shape shown in FIG. 5E. A maximum width W3 of the lower portion of the upper semiconductor chip 158 in the first direction X may be in a range from about 1000 μm to about 10000 μm. A distance D4 in the first direction X from a lower surface of the upper semiconductor chip 150 to a lower end of the provisional trench 163 may be in a range from about 10 μm to about 100 μm. A maximum width W7 of the provisional trench 163 in the second direction Y may be in a range from about 10 μm to about 2000 μm.

Figure 5F:
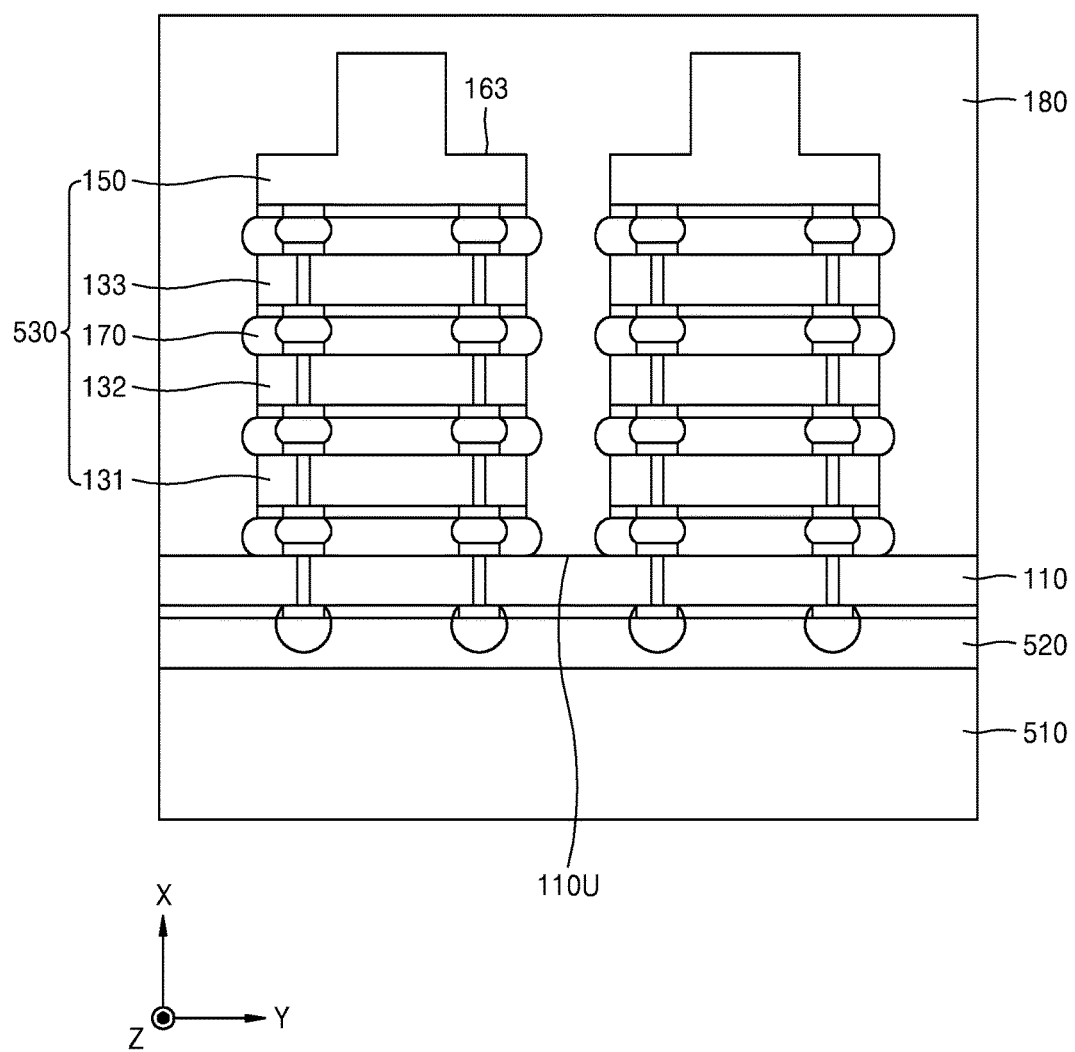

Referring to FIG. 5F, a chip sealing material 180 may be formed to cover the upper surface 110U of the buffer layer 110, sidewalls of the chip adhesive layers 170, sidewalls of the first, second, and third intermediate semiconductor chips 131, 132, and 133, sidewalls of the upper semiconductor chip 150, the upper surface of the upper semiconductor chip 150, and the provisional trench 163.

Figure 5G:
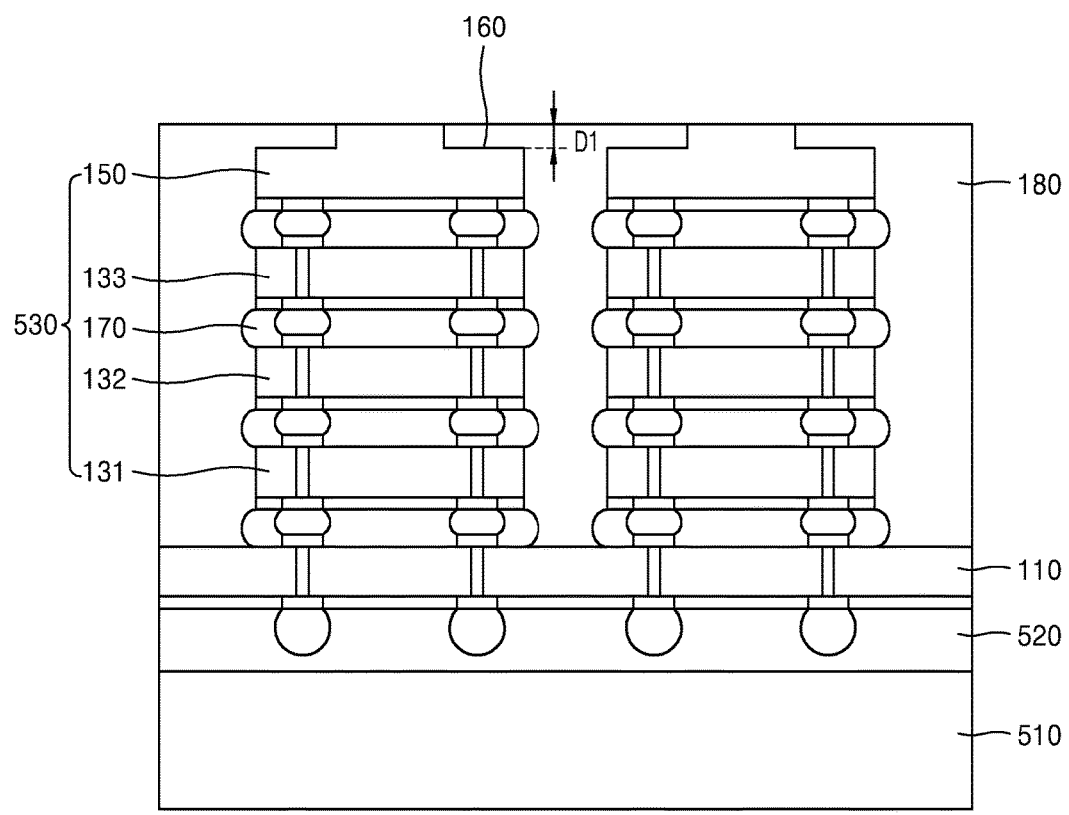

Referring to FIG. 5G, an upper portion of the chip sealing material 180 is polished. The upper surface of the upper semiconductor chip 150 may be exposed by the polishing of the upper portion of the chip sealing material 180. After the chip sealing material 180 and the upper semiconductor chip 150 are further polished, a minimum depth D1 of the completed trench 160 in the first direction X may be less than a minimum depth D6 (refer to FIG. 5E) of the provisional trench 163 in the first direction X.

Figure 5H:
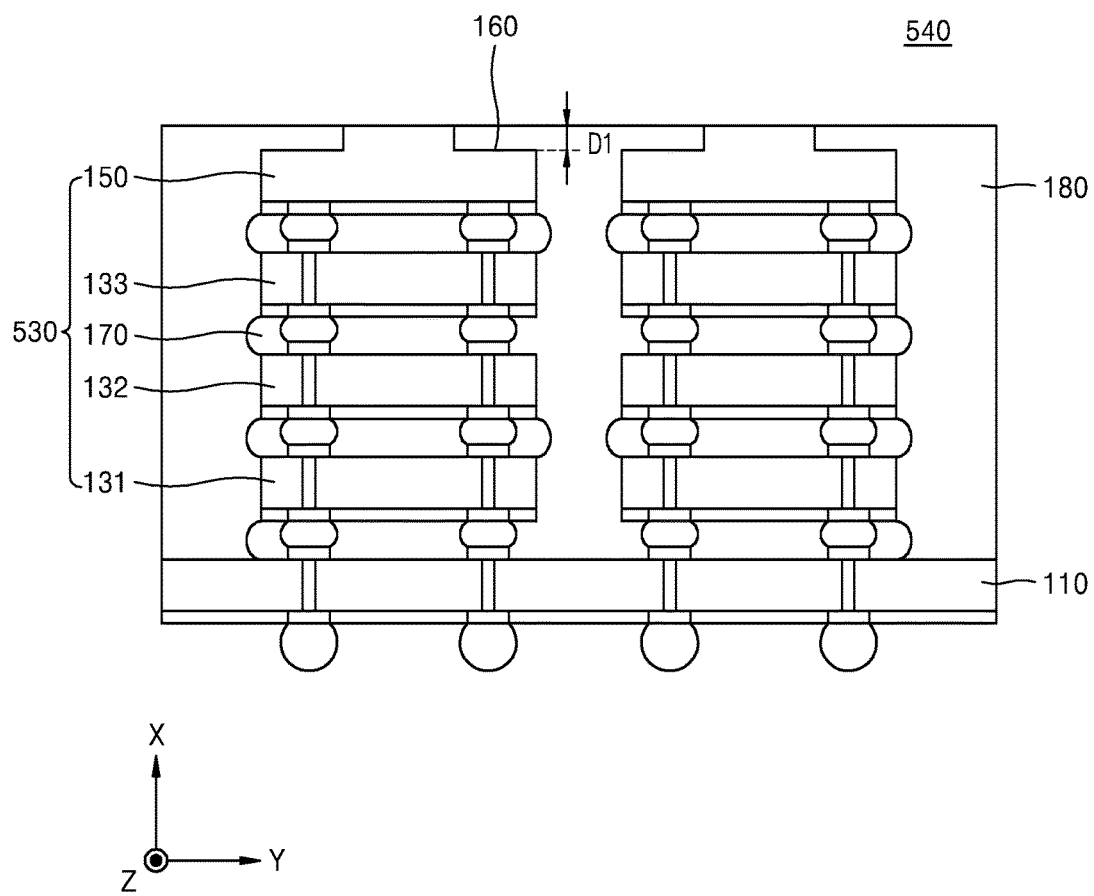

Referring to FIG. 5H, a package array 540 is formed by separating the carrier adhesive layer 520 (refer to FIG. 5G) and the carrier 510 (refer to FIG. 5G) from the buffer layer 110. The carrier adhesive layer 520 may be removed together with or separately from the carrier 510. Afterwards, the package array 540 may be tested whether there is any electrical failure in the package array 540 or not.

Figure 5I:
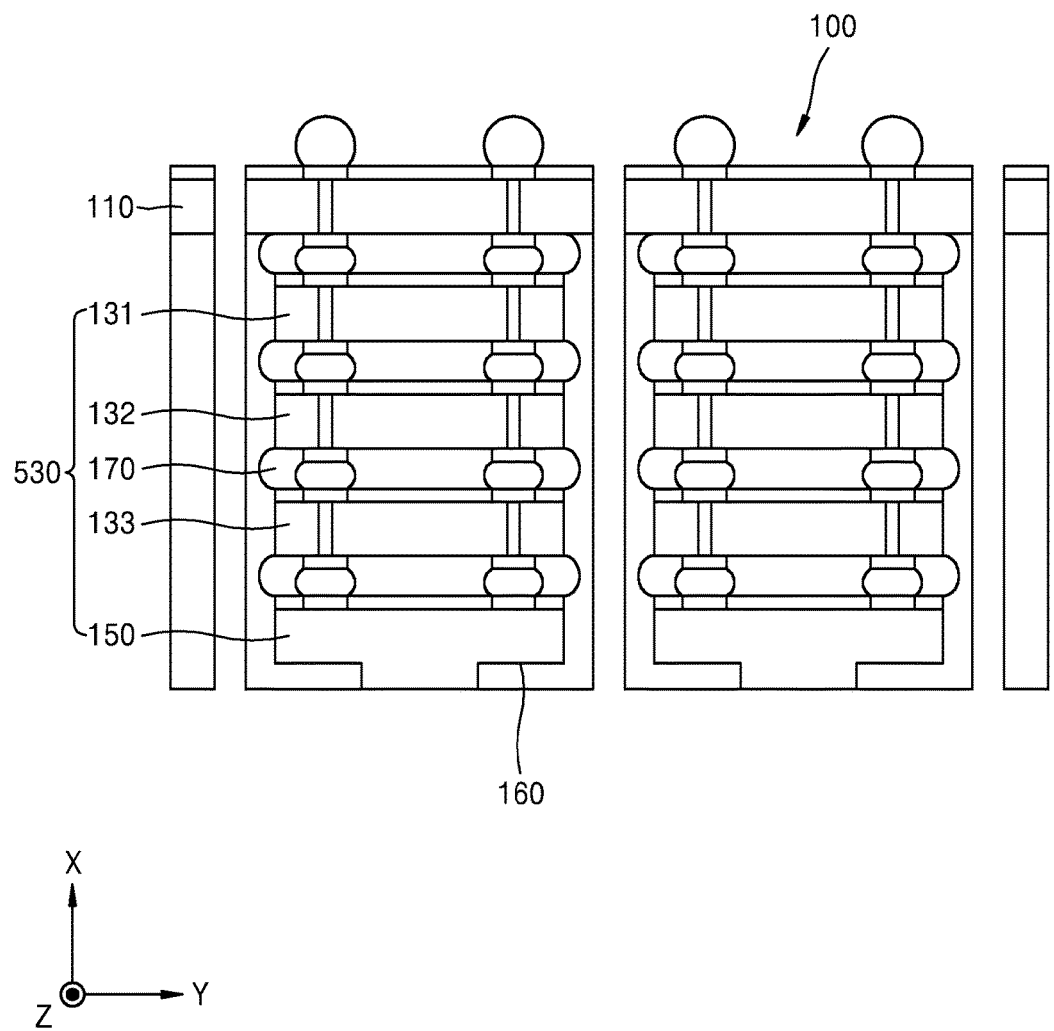

Referring to FIG. 5I, the manufacture of a semiconductor device package according to an embodiment may be completed by cutting the package array 540 (refer to FIG. 5H). The package array 540 may be cut by using a laser cutting method or a saw cutting method. In order to support the package array 540 while the package array 540 is cut, an adhesive layer (not shown) may be attached to a surface of the package array 540 where the upper semiconductor chip 150 is located. The adhesive layer may be removed from the surface of the package array 540 after the cutting is completed. When gaps between the semiconductor chip stacks 530 are cut, the package array 540 may be separated into a plurality of semiconductor device packages 100 each including the individual semiconductor chip stack 530. Thus, the manufacture of the semiconductor device package 100 according to an embodiment may be completed. In some cases, unlike in FIG. 5I, the package array 540 may be cut so that a plurality of the semiconductor chip stacks 530 are included in the individual semiconductor device package.

The embodiments described above should be considered in descriptive sense only and not for purposes of limitation of the technical scope of the inventive concept, and the scope of the present disclosure is not limited by the embodiments described above. Therefore, the scope of the present disclosure is defined not by the detailed description of the present disclosure but by the appended claims, and all differences within the scope will be construed as being included in the present disclosure.

What is claimed is:

1. A semiconductor device package comprising:
  a buffer layer having an upper surface perpendicular to a first direction;
  a plurality of semiconductor chips stacked on the buffer layer one by one in the first direction; and
  a chip sealing material sealing sidewalls of the plurality of semiconductor chips,
  wherein the plurality of semiconductor chips comprise an upper semiconductor chip at a farthest position from the buffer layer and a remaining plurality of intermediate semiconductor chips,
  each of the plurality of intermediate semiconductor chips comprises through silicon vias (TSVs) passing through each of the plurality of intermediate semiconductor chips,
  the upper semiconductor chip comprises a trench formed in at least a portion of a periphery of the upper semiconductor chip and covered by the chip sealing material,
  a depth of the trench varies as a function of position, and
  a position at which the trench has a maximum depth is radially closer to a center of the upper semiconductor chip than a position at which the trench has a minimum depth when a depth of the trench is measured in the first direction.

2. The semiconductor device package of claim 1, wherein a thickness of the upper semiconductor chip in the first direction is different from a thickness of each of the plurality of intermediate semiconductor chips in the first direction.

3. The semiconductor device package of claim 1, wherein the chip sealing material does not cover an upper surface of the upper semiconductor chip.

4. The semiconductor device package of claim 1, further comprising a plurality of chip adhesion layers each located between the plurality of semiconductor chips.

5. The semiconductor device package of claim 1, wherein a minimum depth of the trench in the first direction is less than a distance in the first direction from the buffer layer to a lower surface of the upper semiconductor chip.

6. The semiconductor device package of claim 1, wherein a minimum distance in the first direction from a lower surface of the upper semiconductor chip to a lower end of the trench is less than a distance in the first direction from the buffer layer to the lower surface of the upper semiconductor chip.

7. The semiconductor device package of claim 1, wherein a maximum width of the trench in a second direction, which is parallel to the upper surface of the buffer layer and perpendicular to the first direction, is greater than a minimum depth of the trench in the first direction.

8. The semiconductor device package of claim 1, wherein the trench is formed along an entire periphery of an upper portion of the upper semiconductor chip.

9. The semiconductor device package of claim 1, wherein a sidewall of a lower portion of the upper semiconductor chip contacts the chip sealing material.

10. A semiconductor device package comprising:
a buffer layer having an upper surface perpendicular to a first direction;
a plurality of semiconductor chips comprising a plurality of intermediate semiconductor chips stacked on the buffer layer one by one in the first direction and an upper semiconductor chip on an uppermost one of the plurality of intermediate semiconductor chips; and
a chip sealing material comprising a sidewall portion and a protrusion portion,
wherein the sidewall portion extends in the first direction and seals sidewalls of the plurality of intermediate semiconductor chips,
the protrusion portion is located on an upper end of the sidewall portion and protrudes from an outside of the upper semiconductor chip towards an inside of the upper semiconductor chip,
a length of the protrusion portion in the first direction varies as a function of position, and
the protrusion portion comprise two portions having a maximum length in the first direction and a portion having a minimum length in the first direction between the two portions having the maximum length in the first direction.

11. The semiconductor device package of claim 10, wherein an upper surface of the protrusion portion and an upper surface of the upper semiconductor chip are coplanar.

12. The semiconductor device package of claim 10, wherein a trench is formed in a periphery of the upper semiconductor chip, and the protrusion portion covers the trench.

13. The semiconductor device package of claim 10, wherein a minimum length of the protrusion portion in the first direction is less than a length of the sidewall portion in the first direction.

14. The semiconductor device package of claim 10, wherein a maximum length of the protrusion portion in a second direction which is parallel to the upper surface of the buffer layer, is greater than a minimum length of the protrusion portion in the first direction.

15. The semiconductor device package of claim 10, wherein the protrusion portion seals an entire periphery of an upper portion of the upper semiconductor chip, and
the protrusion portion does not cover an upper surface of the upper portion of the upper semiconductor chip.

16. The semiconductor device package of claim 10 wherein the protrusion portion has a corrugated shape.

17. A semiconductor device package comprising:
a buffer layer having an upper surface perpendicular to a first direction;
a plurality of intermediate semiconductor chips stacked on the buffer layer one by one in the first direction;
an upper semiconductor chip located on an uppermost one of the plurality of intermediate semiconductor chips; and
a chip sealing material sealing sidewalls of the plurality of intermediate semiconductor chips,
wherein a maximum width of an upper portion of the upper semiconductor chip in a second direction, which is perpendicular to the first direction and parallel to the upper surface of the buffer layer, is less than a maximum width of a lower portion of the upper semiconductor chip in the second direction,
wherein a width of the upper portion of the upper semiconductor chip increases toward an upper end of the upper semiconductor chip.

18. The semiconductor device package of claim 17, wherein the chip sealing material covers sidewalls of the upper portion of the upper semiconductor chip and sidewalls of the lower portion of the upper semiconductor chip, and
the chip sealing material does not cover an upper surface of the upper semiconductor chip.

19. The semiconductor device package of claim 17, wherein a minimum thickness of the upper portion of the upper semiconductor chip in the first direction is less than a distance in the first direction from an upper surface of the buffer layer to a lower surface of the upper semiconductor chip.

20. The semiconductor device package of claim 17, wherein a minimum thickness of the lower portion of the upper semiconductor chip in the first direction is less than a distance in the first direction from an upper surface of the buffer layer to a lower surface of the upper semiconductor chip.

21. The semiconductor device package of claim 17, wherein a difference between a maximum width of the upper portion of the upper semiconductor chip in the second direction and a maximum width of the lower portion of the upper semiconductor chip in the second direction is greater than a minimum thickness of the upper portion of the upper semiconductor chip in the first direction.

22. The semiconductor device package of claim 17, wherein the chip sealing material comprising a sidewall portion and a protrusion portion, and
wherein a lower surface of the protrusion portion and an upper surface of the lower portion of the upper semiconductor chip are coplanar and an upper surface of the protrusion portion and an upper surface of the upper portion of the upper semiconductor chip are coplanar.

* * * * *